(12) United States Patent
Winfrey et al.

(10) Patent No.: US 9,514,254 B2
(45) Date of Patent: Dec. 6, 2016

(54) MODULAR MODEL AND SIMULATION ARCHITECTURE

(71) Applicant: The United States of America, as represented by the Secretary of the Navy, Washington, DC (US)

(72) Inventors: Clinton M. Winfrey, King George, VA (US); Benjamin A. Baldwin, King George, VA (US); Mary Ann Cummings, King George, VA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 215 days.

(21) Appl. No.: 13/815,158

(22) Filed: Jan. 24, 2013

(65) Prior Publication Data

US 2015/0127312 A1     May 7, 2015

Related U.S. Application Data

(60) Provisional application No. 61/632,733, filed on Jan. 24, 2012.

(51) Int. Cl.
    *G06G 7/48*            (2006.01)
    *G06F 17/50*          (2006.01)

(52) U.S. Cl.
    CPC ................................ *G06F 17/5009* (2013.01)

(58) Field of Classification Search
    CPC ........... G06F 17/5009; G06F 17/5018; G06F 2217/16
    USPC ........................................................... 703/6
    See application file for complete search history.

(56) References Cited

U.S. PATENT DOCUMENTS

| 7,516,052 | B2* | 4/2009 | Hatcherson | ............... | G06F 9/54 |
| | | | | | 703/13 |
| 8,165,865 | B2 | 4/2012 | Parker et al. | ................... | 703/14 |

(Continued)

OTHER PUBLICATIONS

Zeigler et al., The DEVS environment for high-performance modeling and simulation, 1997, IEEE Computational Science & Engineering, July-September, pp. 61-71.*

(Continued)

*Primary Examiner* — Aniss Chad
(74) *Attorney, Agent, or Firm* — Gerhard W. Thielman, Esq.

(57) ABSTRACT

A computer-implemented modeling-and-simulation coordination module is provided for coordinating components by exchanging and sequencing instructions. The module includes a scenario file generator, a plug-in loader, an interface loader, a module classifier, an event detector, a response initiator, a simulation processor, a model request processor, an instance receiver, and an output provider. The scenario file generator creates a blank scenario file. The plug-in loader loads plug-in modules. The interface loader loads GUIs into corresponding containers. The classifier sets a classification to a highest rank plug-in module. The event detector monitors updating events. The response initiator prompts the operator to select an experimental plug-in module. The simulation processor executes a simulation in response to the operator loading a scenario, setting experimental parameters, and selecting the simulator plug-in. The model request processor provides parameters from the experimental frame to the model plug-in module. The instance receiver receives model instances from the model plug-in module. The output provider displays information based on time controls. The simulation processor instructs the simulator plug-in to execute instructions until satisfaction of terminal conditions and in response to initiation by the experimental plug-in module.

13 Claims, 51 Drawing Sheets

(56) References Cited

U.S. PATENT DOCUMENTS 8,433,554 B2 4/2013 Wasser .............................. 703/22
2010/0042380 A1* 2/2010 Suh et al. ......................... 703/1

OTHER PUBLICATIONS

R. K. Garrett Jr. et al., Managing the Interstitials, a system of systems framework suited for the Ballistic Missile Defense System, NSWCDD, Jul. 2009.

S. A. Selberg, et al., "Toward an Evolutionary System of Systems Architecture", *18 th Annual International Symposium of the INCOSE*, Jun. 2008. http://www.isr.umd.edu/~austin/reports.d/INCOSE2008-paper378.pdf.

C. M. Winfrey et al., "OSM: An Evolutionary System of Systems Framework for Modeling and Simulation", NSWCDD-PN-14-00006, expected to be published 2014.

* cited by examiner

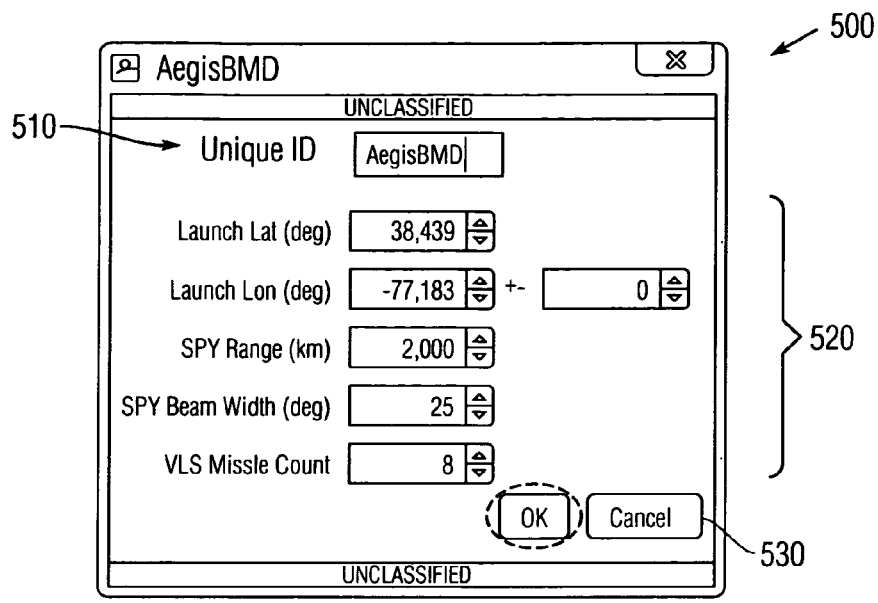
Fig. 5A
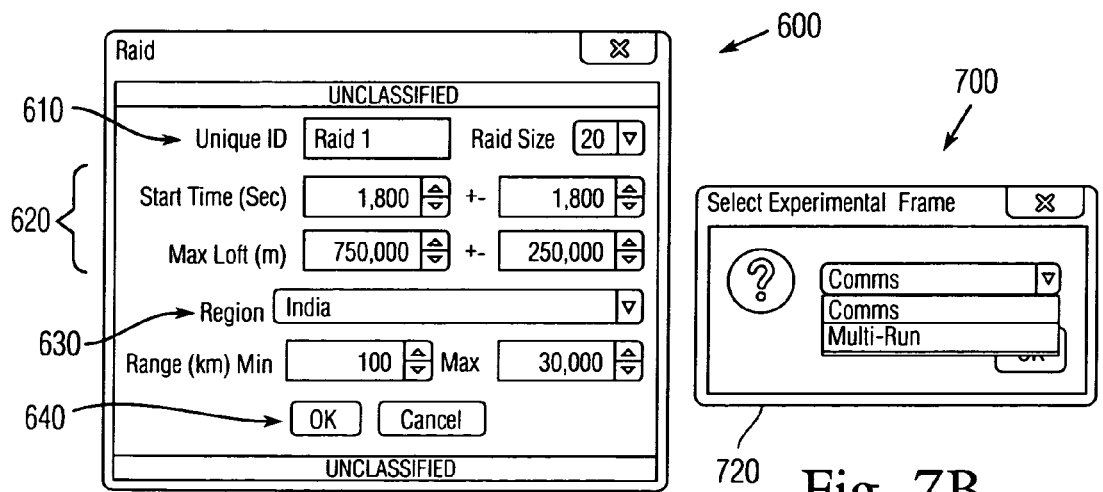
Fig. 6
Fig. 7B

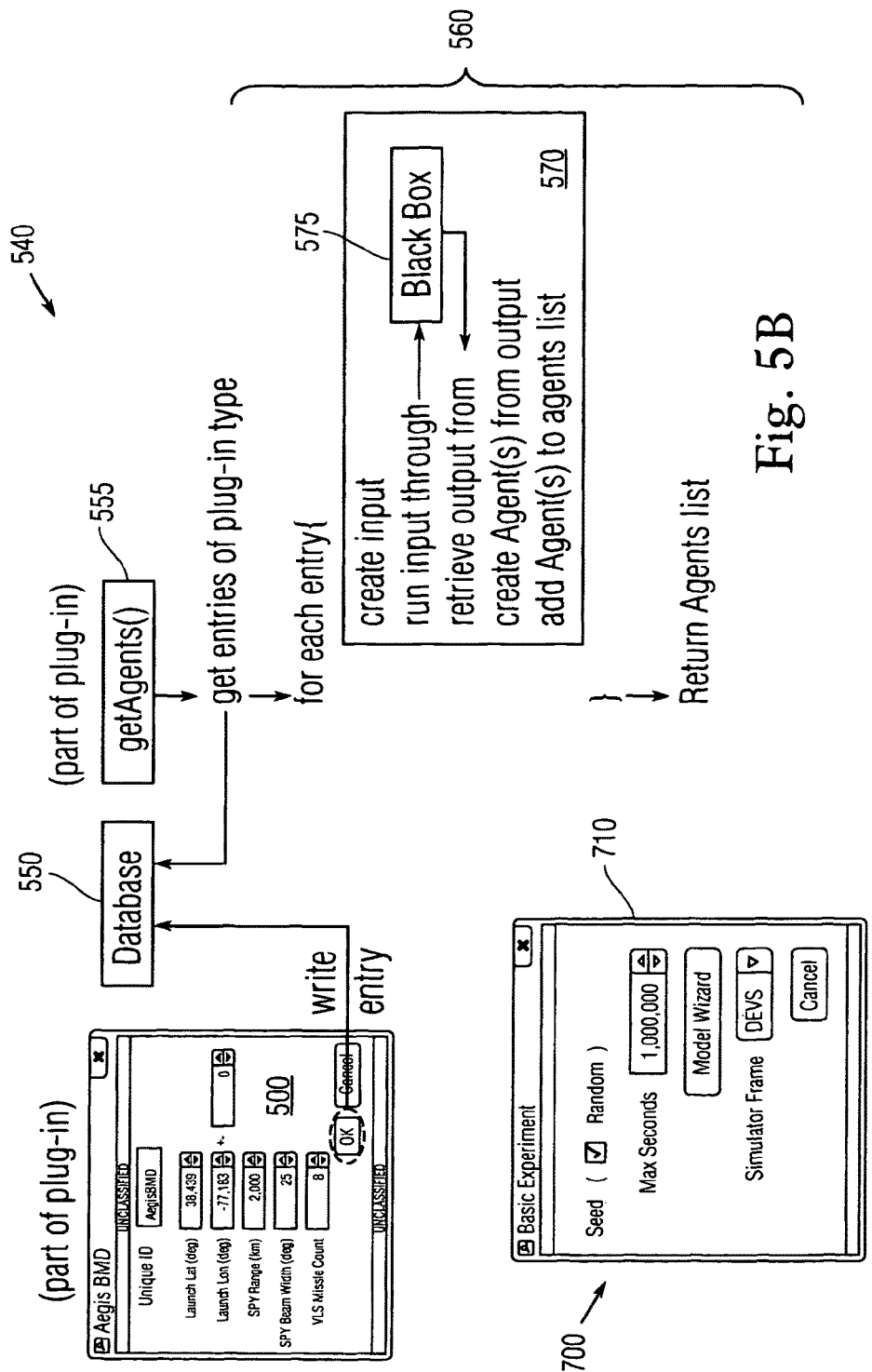

```
//File Name: Dahlgren_ExampleCarrier_Carrier packageagent; //you can put this anywhere; I put it in a package called "agent"

//NetBeans can find these imports for you
import   gov.nasa.worldwind.geom.Position;
import   java.awt.Color;
import   Osmcommon.Const;
import   Osmevent.Event;
import   world.common.WorldAgent;
import   world.common.WorldMath;

//This is a simple WorldAgent "Carrier" that moves from one location to another.
//The WorldAgent class extends the Agent class defined in Osm .
public   class   Dahlgren_ExampleCarrier_Carrier extends  WorldAgent {

//these    variables will be initialized on startup
    int   speed;
    double   startTime ;
    Position      endPosition ;
    double   timeStep = 1; //defines how frequently move Events are supposed to occur //constructor
    public   Dahlgren_ExampleCarrier_Carrier (String id, double beginLat, double
beginLon,
    double endLat, double endLon, int speed, double startTime) {

//initialize variables
        setID(id); //this is the correct way to set the ID for an Agent
        this . speed  = speed;
        this . startTime = startTime;

//initialize visualization;
        //addIcon: provide the icon image location and scale
        trajectory   .addIcon( "data/images/dots/000_255_255.png", 0.12);

addModel   provide   the Wavefront model file and scale
        trajectory .addModel( "data/models/thaad/thaadm.obj", 15, 6.17);

//defines how the Agent's trajectory line movement will look on the map
        trajectory  .initializeTrajectoryLine(newColor(0, 255, 255), 2, 25,
            new Color(0, 255, 255, 50), 3, 1000);

//set first location in trajectory at start, as defined in constructor
        trajectory.add(beginLat, beginLon, 0, 0, 0, 0,
Const.getScenario ().getTime());

//endPosition will be   the location the carrier is trying to go towards
        endPosition = Position. fromDegrees (endLat, endLon, 0);

//look for timeStep defined in experimental plug- in
        if (Plugins.getFromExperiment("timeStep", getID()) != null ) {
            timeStep = (Integer)Plugins.getFromExperiment("timeStep", getID());
        }
```

Fig. 14

```
// schedule the first move Event to be executed
new Event( this, startTime+ timeStep , 1, "Begins movement" ) {
    @Override public void doActions() {
        ((Dahlgren_ExampleCarrier_Carrier)getScheduler()).makeNextMove();
    }
}.schedule();
}
```
1510

```
// this is a libWorld.jar WorldAgent specific method that is used to meet end conditions
@Override
public boolean isWorthSimulating() {
    if (speed > 0) return true ;
    else return false ;
}

// creates a move towards the "endPosition" and schedules the next move Event
public void makeNextMove () {
    double curTime = Const. getScenario ().getTime();

//calculate position that is moving towards endPosition
    Position moveTo =
        WorldMath. getPositionTowards ( trajectory .getLastPosition(),
            endPosition , speed, timeStep );

//add the newly found position to the trajectory
    trajectory .add(moveTo.getLatitude().getDegrees(),
        moveTo.getLongitude().getDegrees(), 0, 0, 0, 0, curTime);
```
1520

```
    //if we haven't reached our destination, we need to keep making move Events
    if (WorldMath. getDistance (moveTo, endPosition ) != 0) {
        new Event( this , curTime+ timeStep , 1) { //schedule to occur at current + step
            @Override public void doActions() {
                ((Dahlgren_ExampleCarrier_Carrier)getScheduler()).makeNextMove();
            }
```
1530

```
            // This Event isn't significant, so override this to return false
            @Override public boolean is Printable () { return false ; }
        }.schedule();
    } else {
        //collect the time metric for when the carrier reaches destination
        addMetric( "Arrival" , "Arrival Time" , curTime, curTime);
    }
}
}
```
1540

```
//File Name: Dahlgren_ExampleCarrier_Dialog

//Create a class uniquely named class, extending ModelDialog
public class Dahlgren_ExampleCarrier_Dialog extends  Model Dialog {

//Constructor gets the Osm EXE parent frame, who passes itself to all
ModelDialogs
    public   Dahlgren_ExampleCarrier_Dialog  (Frame frame) {
        super (frame);
        initComponents();
    } boolean firstOpen = true ; //the first time we open, we initialize values

//onOpen is called when  Osm EXE opens this dialog
    public   void  onOpen () {
        if  ( firstOpen ) {  //initialize  variables on first open
            firstOpen  = false ;  //first open has occurred //set initial values ; this is pretty normal for any GUI. Do this
however you want.
            // OsmLib has a Spinner class that is pretty useful, and this
dialog uses it.
            //setModel arguments are: defaultValue, min, max, increment size
            startTime .setModel(0, 0, Double. MAX_VALUE , 1);
            startTimeVariance .setModel(20, 0, Double. MAX_VALUE , 1);
            beginCEP  .setModel(20000, 0, Double. MAX_VALUE , 1);
            endCEP  .setModel(20000, 0, Double. MAX_VALUE , 1);
            beginLatitude .setValue(38.102);
            beginLongitude .setValue( - 77.64);
            endLatitude  .setValue(38.335);
            endLongitude  .setValue( - 77.05);
        }
    }
}
```

```
//Override this method so that the ClassificationBars get set correctly
@Override
public void setClassification (String str) {
    classificationBar1 .setClassification(str);
    classificationBar2 .setClassification(str);
}
```

```
private void okButtonActionPerformed (java.awt.event.ActionEvent evt) {
    String id = idText .getText();   //collect the Agent ID                              1800

// if we're not editing an existing Agent instance and the ID exists, don't
add the
    //instance. Instead, turn the idLabel foreground red so the user knows to
fix it
    if    (!id.equals(getToEdit()) && exists(id)) {
            idLabel .setForeground(Color. red );                                          1810
    } else   {

// if editing an existing Agent definition, delete the old one before
adding it
    if    (!getToEdit().equals( "" )) { delete(getToEdit()); }                            1820

//c reate a String formatted with an id and a type. Any other variable
    //definitions are left to the plug - in developer to define. These
variables will
    //be read from the Scenario Definition File on editing and instance
creation.
         String threat =        " \ n"   +
                                "id=" + id +  " \ n"   +
                                "type=" + getDialogID() +  " \ n" +
                                "start="    + startTime .getValue() +   " \ n"  +
1830                            "startvariance=" + startTimeVariance .getValue() +  " \ n"  +
                                "speed=" + speed.getValueInt() +   " \ n"  +
                                "speedvariance="   + speedVariance.getValueInt() + " \ n"  +
                                "lat1="   + beginLatitude .getValue() +  " \ n"  +
                                "lon1="   + beginLongitude .getValue() +  " \ n"  +
                                "cep1="   + beginCEP .getValue() +  " \ n"  +
                                "lat2="   + endLatitude .getValue() +  " \ n"  +
                                "lon2="   + endLongitude .getValue() +  " \ n"  +
                                "cep2="   + endCEP .getValue() +   " \ n"  +
                                "************************************************ \ n";
         close();    //Method defined in  Osm to close ModelDialog
         add(threat); //ModelDialog method for adding entry to the Scenario      1840
definition file
         }
    }
```

Fig. 18

```
/*******************************************************************
 *
 *   * This method loads an entry by ID from the Scenario Definition file
 *
 *******************************************************************/
    @Override
    public void  load (String id) {
        //get the entry to edit from Scenario file
        ScenarioEntry entry = getEntry(id);

//populate the dialog
        idText .setText(id);
        startTime .setValue(entry.getFieldDouble( "start" ));
        startTimeVariance .setValue(entry.getFieldDouble( "startvariance" ));
        speed .setValue(entry.getFieldInt( "speed" ));
        speedVariance .setValue(entry.getFieldInt( "speedvariance" ));
        beginLatitude .setValue(entry.getFieldDouble( "lat1" ));
        beginLongitude .setValue(entry.getFieldDouble( "lon1" ));
        beginCEP .setValue(entry.getFieldDouble( "cep1" ));
        endLatitude .setValue(entry.getFieldDouble( "lat2" ));
        endLongitude .setValue(entry.getFieldDouble( "lon2" ));
        endCEP .setValue(entry.getFieldDouble( "cep2" ));
    }
```

- 1910 (lines from @Override through getEntry(id);)
- 1920 (lines populating the dialog)
- 1900 (entire block)

Fig. 19

```
//file name: Dahlgren_ExampleCarrier_Plugin

//NetBeans can find these imports for you
    import    agent.Dahlgren_ExampleCarrier_Carrier;
    import    java.awt.Frame;
    import    java.util.ArrayList;
    import    Osm.a gent.Agent;
    import    Osm.common.Const;
    import    Osm.common.ScenarioEntry;
    import    Osm.gui.ModelDialog;
    import    stuf.plugins.types.IAgentPlugin;
    import    world.common.WorldMath;

//implements IAgentPlugin
public class Dahlgren_ExampleCarrier_Plugin  implements  IAgentPlugin {

Dahlgren_ExampleCarrier_Dialog dialog;   //an instance of the dialog class
created earlier //Every model plug - in needs a getId method. This is what the plug - in
will be identified
    //as in the Osm EXE GUI
    public String getId() {
        return "Carrier" ;
    }
```

```
        //Every model plug-in needs a getType method. This is the category
that the plug - in will
        //be organized into in the Osm EXE GUI. It's also the "type" that the
model instances
        //will be associated with
        public    String getType() {
            return    "Boat"   ;
        }                                          ⎫
                                                   ⎬ 2110
                                                   ⎭

//Every model plug in needs to provide a classification
        public   String getClassification() {
            return "UNCLASSIFIED"  ;               ⎫
        }                                          ⎬ 2120
                                                   ⎭

//This is an advanced feature; some output plug - ins may look for
packages from plug - ins
        //that provide special functionality. You will usually simply return
null.
        public  Object getPackage() {
            return  null  ;                        ⎫
        }                                          ⎬ 2130
                                                   ⎭

//This class allows Osm EXE to set itself as the parent frame. This is
why we don't
        //initialize the "dialog" when we create it initially.
        public   void   setFrame(Frame frame) {
            if  (dialog == null  ) {
                dialog = new Dahlgren_ExampleCarrier_Dialog(frame);
                dialog.setDialogID(getId());  //set the ID for the dialog to
match the plug - in ID                         ⎫
            }                                      ⎬ 2140
        }                                          ⎭

// Osm EXE requests the dialog
        public   ModelDialog getDialog() {         ⎫
            return   dialog;                       ⎬ 2150
        }                                          ⎭
```
2100

Fig. 21

```
//Everything else so far is potatoes. This is the meat. Every model plug - in has a
//getAgents method that gets entries created by the user (typically through the
dialog)
//and creates Agents out of them. It does this by getting every entry in the
Scenario
//Definition file and looking through each one to see the "type" of model plug - in
that
//created it. If the "type" matches this plug in, we create an instance from the
entry.
    public    ArrayList<Agent> getAgents() {
        ArrayList<Agent> carriers =    new  ArrayList<Agent>();
        for    (ScenarioEntry entry : Const.getScenarioEntries()) {          2200
            if (entry.getType().equals(dialog.getDialogID())) {

//define variables based on text file
                String id = entry.getField( "id" );
                int  start = (   int )entry.getFieldDouble( "start" );
                int  startVariance = (    int )entry.getFieldDouble( "startvariance" );
                int  speed = entry.getFieldInt( "speed"  );
                int  speedVariance = entry.getFieldInt( "speedvariance" );
                double   lat1 = entry.getFieldDouble( "lat1" );
2210        double   lon1 = entry.getFieldDouble( "lon1" );
                double   cep1 = entry.getFieldDouble( "cep1" );
                double   lat2 = entry.getFieldDouble( "lat2" );
                double   lon2 = entry.getFieldDouble( "lon2" );
                double   cep2 = entry.getFieldDouble( "cep2" );

//perform calculations  on variables to introduce randomization. The
                //randLatLon method will take a latitude, longitude, and "cep" (circle
within
                //a certain number of meters and return a double[ ] with a new lat/lon.
The
                //getValue method takes a value, a variance, a minimum, and a maximum
and
                //returns a value within the range of the variance (no less than min,
no more
                //than max)
                double  [ ] launchPlusCEP1 = WorldMath.randLatLon(lat1, lon1, cep1);
                lat1 = launchPlusCEP1[0];
                lon1 = launchPlusCEP1[1];
                double  [ ] bunchPlusCEP2 = WorldMath.randLatLon(lat2, lon2, cep2);
2220        lat2 = launchPlusCEP2[0];
                lon2 = launchPlusCEP2[1];
                start = Const.getValue(start, startVariance, 0, Integer.MAX_VALUE);
                speed = Const.getValue(speed, speedVariance, 0, Integer.MAX_VALUE);

//create an Agent from our Agent class defined earlier and add it to
carriers
                carriers.add( new  Dahlgren_ExampleCarrier_Carrier(id, lat1, lon1, lat2,
lon2,
                                          speed, start));                          2230
            }.
        }
        return  carriers; //return all created carriers
    }
}
```

Fig. 22

```
//extend the ExperimentalPanel class in Osm library
public class Dahlgren_ExampleBasicExperiment_Panel extends ExperimentalPanel {
    Random ra ndom =  new Random();                                              2300
    long seed = - 1;

//initialize values in the GUI
    public Dahlgren_ExampleBasicExperiment_Panel() {
        initComponents();  //this panel's GUI design (function left out for
readability)
        seedText.setText( new Random().nextInt(1000000) + "" );
        maxSeconds.setModel(1000000, 0, Double.MAX_VALUE, 1);

// populate Simulator plug - in selection; make DEVS the default selection    2310
        String[] simFrameIDs = Plugins.getSimulatorPluginIDs();
        simFrameSelector.setModel( new DefaultComboBoxModel(simFrameIDs));
        for ( int i = 0; i < simFrameIDs.length; i++) {
            if (simFrameIDs[i].equals( "DEVS" )) {
simFrameSelector.setSelectedIndex(i); }
        }

}

// execute the model wizard in Osm executable
    private void runModelWizardActionPerformed(java.awt.event.ActionEvent evt) {
        fireChangeEvent( "modelwizard" );
    }

// execu te the simulation as if the run button had been pressed              2320
    public void performRun() {
        runButtonActionPerformed( null );
    }

// the run button has been pressed; execute the simulation
    private void runButtonActionPerformed(java.awt.event.ActionEvent evt) {

//set randomization seed
        if (randomSeedBox.isSelected()) {
            seed = new Random().nextInt(1000000);
            random.setSeed(seed);
            seedText.setText(seed+ "" );                                          2330
        } else if (!randomSeedBox.isSelected()) {
            seed = Integer.parseInt(seedText.getText());
            random.setSeed(Integer.parseInt(seedText.getText()));
        }

//select the simulator plug- in
        Plugins.setSimulatorPluginIndex(simFrameSelector.getSelectedIndex());

//initialized Scenario and run it
        Const.getScenario().init();
        Plugins.getSimulatorPlugin().runScenario();
                                                                                  2340
        //"updateUI - CLEAR" tells output plug - ins to clear previous run data
        fireChangeEvent( "updateUI - CLEAR" );
        //fireChangeEvent("updateUI- !CLEAR");
    }
}
```

Fig. 23

```
//experimental plug - in defines end conditions ; in this one, our end
conditions are that
    //1) time has not passed the maxSeconds limit and that 2) an Agent still
exists that is
    //worth simulating
    public  boolean  endConditionsMet() {

//see if we're past max second
        if (Const.getScenario().getTime() > maxSeconds.getValue()) {
            return   true  ;
        }

//see if any Agents worth simulating are alive
        boolean hasLivingAgentWorth Simulating  =  false  ;
        for   (WorldAgent agent :
Const.getScenario().getAgents(WorldAgent. class   )) {
                if   (agent.isWorthSimulating() && !agent.isDestroyed()) {
                    hasLivingAgentWorthSimulating   =  true  ;
                }
        }
        return !hasLivingAgentWorthSimulating  ;
    }

//  Agents can request information from the experimental plug - in. This is
how it's done
        @Override
        public  Object get(String item, String requestor) {
            if    (item.equals(  "random.nextDouble"  )) {
                return   random.nextDouble();
            } else   if (item.equals(  "random.nextInt"  )) {
                return   random.nextInt();
            } else    if (item.equals(  "random.nextFloat"  )) {
                return random.nextFloat();
            } else    if (item.equals(  "random.nextBoolean"  )) {
                return   random.nextBoolean();
            } else    if (item.equals(  "seed"  )) {
                return seed;
            }
            return   null  ;  //experiment doesn't have the answer to the question
        }

// default width for popout
    public   int    getDefaultWidth() {
        return  208;
    }

// default height for popout
    public   int   getDefaultHeight() {
        return  201;
    }

```
import Osm.common.Scenario;
import Osm.gui.ExperimentalPanel;                                    2500
import stuf.plugins.types.IExperimentalPlugin;

//class implements the IExperimentalPlugin class defined in Osm library
public class Dahlgren_ExampleBasicExperiment_Plugin implements
IExperimentalPlugin {

Dahlgren_ExampleBasicExperiment_Panel panel; //an instance of the panel
we defined above
      Scenario scenario = new Scenario();  //the Scenario that collects Agents
from model plug - ins //plug - in ID
          public String getId() {
                return "Basic Experiment" ;
          }

//plug - in classification
          public String getClassification() {
                return "UNCLASSIFIED" ;          2510
          }

//plug - in type
          public String getType() {
                return "experimental" ;
          }

// returns the panel that goes with this experimental frame
          public ExperimentalPanel getPanel() {
                if  (panel == null ) {
                      panel = new Dahlgren_ExampleBasicExperiment_Panel();   2520
                }
                return panel;
          }

// Osm executable can execute the experiment directly, if this plug - in
allows it here
          public void runExperiment() {
                panel.performRun();              2530
          }

//returns the Scenario defined in this plug - in
          public  Scenario getScenario() {      2540
                return scenario;
          }

//tells whether the end conditions for the simulation have been met
          public boolean endConditionsMet() {
                return panel.endConditionsMet();    2550
          }
}
```

Fig. 25

```
//File name: SimulatorDEVS_Plugin

//NetBeans can find these imports for you
import  Osm.agent.Agent;
import  Osm.common.Const;
import  Osm.common.Plugins;
import  Osm.event.EventCenter;
import  stuf.plugins.types.ISimulatorPlugin;
```
}⎬ 2610

2600

```
//implements the ISimulatorPlugin class defined in   OsmLIB
public  class  SimulatorDEVS_Plugin  implements  ISimulatorPlugin {

//Every simulator plug - in needs a unique ID
    public   String getId () {
        return  "DEVS"  ;
    }
```
}⎬ 2620

```
    //Every plug- in requires a getType() method. Just return "simulator".
    public  String getType() {
        return  "simulator"  ;
    }
```
}⎬ 2630

```
    //Every plug- in requires a getClassification() method. Just return
"UNCLASSIFIED".
    public   String getClassification() {
        return   "UNCLASSIFIED" ;
    }
```
}⎬ 2640

```
    //setTime is used for human/hardware in-the-loop simulations.
    //This plug-in is not for that purpose.
    @Override
    public  void  set Time( double  time) {
        //if this was a human or hardware in-the-loop simulation, Osm EXE would
set the
        // scenario's time as the time control increased, as follows:
        //Const.getScenario().setTime(time);
    }
```
}⎬ 2650

Fig. 26

```
// This is the meat of the plug in. It is where we define the algorithm for    2700
executing the
//simulation.
@Override
public void runScenario() {

//do whatever each agent wants to do before running the simulation  ⎫
    for  (Agent agent : Const.getScenario().getAgents()) {              ⎬ 2710
        agent.doBeforeSimulation();                                     ⎭
    }

⎧ // execute   DEVS algorithm
        ⎪ double   time = EventCenter.getFirstEventTime();
 2720   ⎨ while  (time != - 1 && !Plugins.getExperimentalPlugin().endConditionsMet()) {
        ⎪     Const.getScenario().setTime(time);
        ⎪     time = EventCenter.getNextEventTime(time);
        ⎩ }

//do whatever each agent wants to do after running the simulation   ⎫
    for  (Agent agent : Const.getScenario().getAgents()) {              ⎬ 2730
        agent.doAfterSimulation();                                      ⎭
    }
}
}
```

Fig. 27

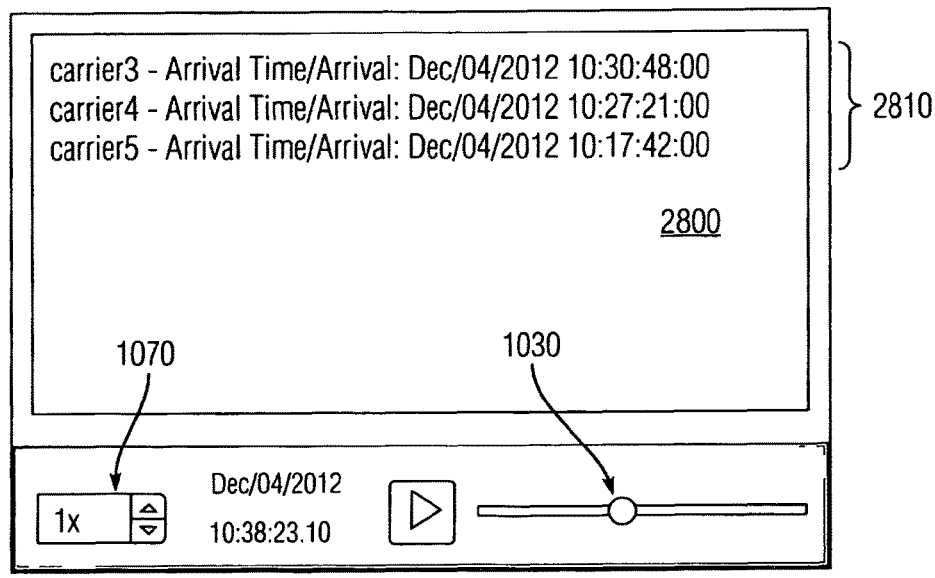

Fig. 28

```
// File name: Dahlgren_ExampleOutput_Panel

// NetBeans can find these for you                                    } 2900
import Osm.agent.Agent;
import Osm.common.AgentMetric;                                        } 2910
import Osm.common.Const;
import Osm.gui.OutputPanel;

// OutputPanel is defined in the Osm library
public class Dahlgren_ExampleOutput_Panel extends OutputPanel {

//GUI components
    private javax.swing.JScrollPane scrollPane;                       } 2920
    private javax.swing.JTextArea metricsTextArea;

// initialize the GUI
    public Dahlgren_ExampleOutput_Panel() {
        // code removed from this method;  the GUI design is not relevant  } 2930
    }

//initialize the time and information displayed
    public void update() {                                            } 2940
        metricsTextArea.setText( "" );
    }

//Whenever the time is updated, we can modify what is shown for that time
    public void setTime( double time) { // time is provided by Osm executable's time } 2950
control
        StringBuilder metricData = new StringBuilder();
        for (Agent agent : Const.getScenario().getAgents()) {
            for (AgentMetric metric : agent.getMetrics() ) {
                // add metric information that has been collected up to this point in
time
                if (metric.getTime() < time) {
2960                metricData.append(agent.getID() + " - " + metric.getGroupID()
                        + "/" + metric.getMetricID() + ":" +
                        Const.getTimeStr((Double)metric.getValue()) + " \ n " );
                }
            }
        }
        metricsTextArea.setText(metricData.toString()); // update the GUI with metric
info
    }

//defines pop-out height
    public int getDefaultHeight() {                                   } 2970
        return 400;
    }

//defines pop-out width
    public int getDefaultWidth() {                                    } 2980
        return 400;
    }

| ModelPanel |
|---|
| Attributes |
| package String pluginType = ""
package Writer modelWriter
package Agent models[0..*] = new ArrayList<Agent>()
package Agent highlightedModels[0..*] = new ArrayList<Agent>()
package ModelDialog modelDialogs[0..*] = new ArrayList<ModelDialog>()
package String eventType = ""
package boolean updatingTree = false
private Event ListenerList listenerList = new EventListenerList()
private JCheckBox followSelectModels
private JScrollPane jScrollPane1
private JTree tree
private JComboBox viewCombo |
| Operations |
| public ModelPanel( )
public void init ( String plugin Type, ModelDialog modelDialogs[0..*]
private void initComponets( )
private void followSelectedModelsStateChanged( ChangeEvent evt )
private void addModelSateChanged( ChangeEvent evt )
private void editModelSateChanged( ChangeEvent evt )
private void deleteModelSateChanged( ChangeEvent evt )
private void viewComboItemSateChanged( ItemEvent evt )
private void treeValueChanged( TreeSelectionEvent evt )
public void updateSelectedModels( )
public void updateTree( Agent models[0..*], double time, boolean treeChanged )
public void setClassification( String Classification )
private void modelEvent( )
public String getPlugin Type( )
public ModelDialog[0..*] getModelDialogs( )
public void addChangeListener( ChangeListener cl )
public void removeChangeListener( ChangeListener cl )
protected void fireChangeEvent( )
public String getEventType( ) |

| ManiGui |
|---|
| Attributes |
| package ExperimentalPanel expPanel<br>package OutputPanel outputPanels [0..*] = new ArrayList<OutputPanel>()<br>package int panelSelected = -1<br>package long sliderMovement = new Date().getTime()<br>package long lastSliderMovement = new Date().getTime()<br>package double lastUpdateTime = -1<br>private JMenuItem aboutMI<br>private ClassificationBar classificationBar1<br>private ClassificationBar classificationBar2<br>private JMenuItem clearScenarioMI<br>private JMenu editMenu<br>private JMenuItem expFrameMI<br>private JMenu fileMenu                             <u>3220</u><br>private JMenu helpMenu<br>private JMenuBar jMenuBar<br>private JSplitPane jSplitPane<br>private JMenuItem loadScenarioMI<br>private JPanel rightPanel<br>private JMenuItem saveScenarioMI<br>private JTabbedPane tabs |
| Operations |
| public MainGui( )<br>private void runModelWizard( int index )<br>private void initComponents( )<br>private void loadScenarioMIActionPerformed( ActionEvent evt )<br>private void saveScenarioMIActionPerformed( ActionEvent evt )<br>private void clearScenarioMIActionPerformed( ActionEvent evt )<br>private void timeSelectorStateChanged( ChangeEvent evt )<br>private void animatedGUI( boolean tabChanged )<br>private void modelsPanelStateChanged( ChangeEvent evt )<br>private void popFrame( boolean pop, PopDialog frame, PopPanel panel )<br>private void addTab( PopDialog frame, popPanel popPanel )<br>private PopPanel getPopPanelBytitle( String outputTitle )<br>private void aboutMIActionPerformed( ActionEvent evt )<br>private void expFrameMIActionPerformed( ActionEvent evt )<br>private void tabsStateChanged( ChangedEvent evt )<br>private void runExpFrameChooser( )<br>private void updateUI( boolean clear )<br><u>public void main( String args[0..*] )</u> |

Fig. 32C

| TimeSelector |
|---|
| Attributes |
| private double lastValue = 0           3230<br>package Timer timer<br>package long curMilli<br>package long prevMilli<br>private ChangeEvent changeEvent = null<br>private EventListenerList listenerList = new EventListenerList ()<br>private JLabel dateLabel<br>private JPanel datePanel<br>private JButton playButton<br>private JSpinner speedSpinner<br>private JLabel timeLabel<br>private JSlider timeSlider |
| Operations |
| public TimeSelector( )<br>public void updateSlider( double seconds )<br>private void initComponents( )<br>private void playButtonActionPerformed( ActionEvent evt )<br>private void timeSliderStateChanged( ChangeEvent evt )<br>public double getValue( )<br>public void setValue( double value )<br>public double getMinimum( )<br>public void setMinimum( double value )<br>public double getMaximum( )<br>public void setMaximum( int value )<br>private void increaseSlider( )<br>public void setSliderEnabled( boolean bool )<br>public void addChangeListener( ChangeListener cl )<br>public void removeChangeListener( ChangeListener cl )<br>protected void fireChangeEvent( )<br>public boolean isPlaying( ) |

Fig. 32D

| PopButon |
|---|
| Attributes |

3240 package String label = ""
package JMenuItem items[0..*] = new ArrayList<JMenuItem>()
package String selected = ""
private ChangeEvent changeEvent = null
private EventListenerList listenerList = new EventListenerList()
private JMenuBar bar
private JMenu button
private JInternalFrame internal

| Operations |
|---| public PopButton( )
public void setLabel( String label )
public void addItem( String selection )
private void initComponents( )
private void buttonMousePressed( MouseEvent evt )
public void itemActionPerformed( ActionEvent evt, String selection )
public String getSelection( )
public void addChangeListener( ChangeListener cl )
public void removeChangeListener( ChangeListener cl )
protected void fireChangeEvent( )

Fig. 32E

| ModelsPanel |
|---|
| Attributes |

3250 package String eventType = ""
private EventListenerList listenerList = new EventlistenerList()
private JTabbedPane weaponTabs

| Operations |
|---| public ModelsPanel( )
public void init( )
public ModelDialog[0..*] getPanelDialogs( String type )
public void setClassification( String classification )
public void updateCheckBoxes( )
public void updateScenarioInfo( double time, boolean treeChanged )
private void initComponents( )
public void addChangeListener( ChangeListener cl )
public void removeChangeListener( ChangeListener cl )
protected void fire ChangeEvent( )
public String getEventType( )
public ModelPanel[0..*] getModelPanels( )

Fig. 32F

| PopDialog |
|---|
| Attributes |

3260 package boolean open = false
private JTabbedPane tabs = new javax.swing.JTabbedPane ()
private ChangeEvent changeEvent = null
private EventListenerList listenerList = new EventListenerList ()
package boolean listening = false

| Operations |
|---| package PopDialog( )
package PopDialog( Frame owner )
public boolean isOpen( )
private void formWindowClosing( WindowEvent evt )
public void init( String title, JPanel panel, int height, int width )
public void addChangeListener( ChangeListener cl )
public void removeChangeListener( ChangeListener cl )
protected void fireChangeEvent( )
protected void setListening( boolean bool )
public boolean isListening( )

Fig. 32G

| Const |
|---|
| Attributes |
| package Date startDate = new Date()<br>package boolean scenarioPlaying = false<br>package double playbackTime = 0 |
| Operations |
| public void setPlaybackTime( double playback Time )<br>public double getPlaybackTime( )<br>public void setStartDate( Date date )<br>public Date getStartDate( )<br>public void setScenarioPlaying( boolean playing )<br>public boolean isScenarioPlaying( )<br>public double randDouble( double min, double max, long seed )<br>public int randInt( int min, int max, long seed )<br>public double getValue( double value, double variance, double min, double max )<br>public int getValue( int value, int variance, int min, int max )<br>public double getMin( double values[0..*] )<br>public double getMax( double values[0..*] )<br>public ScenarioEntry[0..*] getScenarioEntries( )<br>public void unzip( String zipfile )<br>public void zip( String files[0..*], String destination )<br>public void copyFile( File sourceFile, File destFile )<br>public int str2Num( String str )<br>public Scenario getScenario( )<br>public String getSetting( string value )<br>public Date getDate( double time )<br>public String getTimeStr( double time )<br>public int getMostRecentTimeIndex( double time, Double times[0..*] ) |

| Plugins |
|---|
| Attributes       3320 |
| package int experimentalPluginIndex = 0<br>package int simulatorPluginIndex = 0 |
| Operations |
| private PluginFactory getPluginFactory( )<br>private String[0..*] getIDs( T plugins[0..*] )<br>public String[0..*] getExperimentalPluginIDs( )<br>public void setExperimentalPluginIndex( int expPluginIndex )<br>public IExperimentalPlugin[0..*] getExperimentalPlugins( )<br>public IExperimentalPlugin getExperimentalPlugin( )<br>public Object getFromExperiment( String item, String requestor )<br>public String[0..*] getSimulatorPluginIDs( )<br>public void setSimulatorPluginIndex( int simPluginIndex )<br>public ISimulatorPlugin[0..*] getSimulatorPlugins( )<br>public ISimulatorPlugin getSimulatorPlugin( )<br>public IAgentPlugin[0..*] getAgentPlugins( )<br>public IOutputPlugin[0..*] getOutputPlugins( ) |

Fig. 33C

| Plugins |
|---|
| Attributes |
| package int prevSpinner = 0 <br> package String a = "" <br> private ChangeEvent changeEvent = null <br> private EventListenerList listenerList = new EventListenerList () <br> private JLabel label <br> private JSpinner spinner |
| Operations |
| public Spinner( ) <br> public void setModel( double start, double min, double max, double precision ) <br> public void setLabel( String str ) <br> public void setEnabled( boolean bool ) <br> public Double getValue( ) <br> public int getValueInt( ) <br> public void setValue( double d ) <br> private void initComponents( ) <br> private void spinnerStateChanged( ChangeEvent evt ) <br> public void addChangeListener( ChangeListener cl ) <br> public void removeChangeListener( ChangeListener cl ) <br> public void fireChangeEvent( ) |

| ClassificationBar | |
|---|---|
| Attributes | |
| package int classificationNum = -1<br>package String classifications[0..*] = {"UNKNOWN", "UNCLASSIFIED", "CONFIDENTIAL", "SECRET", "TOP SECRET"}<br>package Color backgroundColors[0..*] = {new color(150, 150, 150), new Color(0, 150, 0), new Color(0, 0, 255,), new Color(255, 0, 0), new Color(255, 176, 0),}<br>package Color forgroundColors[0..*] = {new color(255, 255, 255), new Color(255, 255, 255), new Color(255, 255, 255), new Color(255, 255, 255), new Color(255, 255, 255)}<br>private JLabel classLabel | |
| Operations | |
| public ClassificationBar( )<br>private int indexOf( String classification )<br>public void setClassification( String classification )<br>public String getClassification( )<br>private void initComponents( ) | |

| Agent | |
|---|---|
| Attributes | |
| protected String id<br>protected String pluginType<br>package boolean followed = false<br>package boolean selected = false<br>protected double destroyTime = Double.MAX_VALUE | 3410 |
| Operations | |
| public void setID( String id )<br>public String getID( )<br>public void addCoupling( Agent agent )<br>public void removeCoupling( Agent agent )<br>public void addCouplings( ArrayList agents )<br>public void remove couplings( Agent agents[0..*] )<br>public void addEvent( Event event )<br>public Event[0..*] getEvents( )<br>public void cancelEventsAfter( double time )<br>public boolean is destroyed( )<br>public boolean isDestroyedAt( doubleTime )<br>public void destroy( )<br>public double getDestroyTime( )<br>public double getStartTime( )<br>public double getEndTime(<br>public boolean containsTime( double time )<br>public Agent[0..*] getCoupledAgents( )<br>public T[0..*] getCoupledAgents( Class<T> type )<br>public void moreDestroy( )<br>public String toString( )<br>public void addChild( Agent child )<br>public void addChildren( Agent children[0..*] )<br>publicAgent[0..*] getChildren( )<br>public T[0..*] getChildren( Class<T> type )<br>public String[0..*] getChildrenIDs( )<br>public boolean hasChildren( )<br>public void setPluginType( String pluginType )<br>public String getPluginType( )<br>public void addNote( String note, double time )<br>public void addNote( String note, double time, int order )<br>public String getNote( double time )<br>public void addMetric( AgentMetric metric )<br>public void addMetric( String metricID, String groupID, double time, Object value )<br>public void addMetric( String metricID, String groupID, double time, Object value, Strijng unit )<br>public AgentMetric[0..*] getMetrics( )<br>public void do BeforeSimulation( )<br>public void doAfterSimulation( )<br>public double getMaxSimulationTime( )<br>public void setFollowed( boolean followed )<br>public boolean isFollowed( )<br>public void setSelected( boolean selected )<br>public boolean isSelected( ) | |

Fig. 34B

| AgentCreator | |
|---|---|
| Attributes | 3420 |
| Operations | |
| public Agent[0..*] createAgents( Agents agents[0..*] ) | |

Fig. 34C

| AgentNote | |
|---|---|
| Attributes | 3430 |
| package String note<br>package double time<br>package int order | |
| Operations | |
| public AgentNote( String note, double time )<br>public AgentNote( String note, double time, int order )<br>public String getNote( )<br>public double getTime( )<br>public int getOrder( )<br>public int compareTo( AgentNote n )<br>public String toString( ) | |

Fig. 34D

| AgentCreator |
|---|
| Attributes |
| package String metricID<br>package String groupID<br>package double time         3440<br>package Object value<br>package String unit = "" |
| Operations |
| public AgentMetric( String metricID, String groupID,<br>        Agent agent, double time, Object value, String unit )<br>public String getMetricID( )<br>public String getGroupID( )<br>public Agent getAgent( )<br>public double getTime( )<br>public Object getValue( )<br>public String getUnit( ) |

Fig. 34E

| Event |
|---|
| Attributes |
| package double timeToExecute = -99       3450<br>package double executeTime = -99<br>package double scheduleTime = -99<br>package double cancelTime = -99<br>package int priority = 0<br>package String label<br>package int executionNumber = -1 |
| Operations |
| public Event( Agent scheduler, Agent agents[0..\*],<br>          double timeToExecute, int priority, String label )<br>public T getScheduler( )<br>public boolean isWorthSaving( )<br>public double getTimeToExecute( )<br>public int getPriority( )<br>publicString getLabel( )<br>public void execute( )<br>public void schedule( )<br>public void cancel( )<br>public void setCancelTime( double time )<br>public double getExecuteTime( )<br>public double getScheduleTime( )<br>public double getCancelTime( )<br>public void doActions( )<br>public int compareTo( Event e )<br>public Agent getAgent( )<br>public Agent[0..\*] getAgents( )<br>public void setExecutionNumber( int executionNumber )<br>public int getExecutionNumber( )<br>public T getAgent( Class<T> type )<br>public T[0..\*] getAgents( Class<T> type )<br>public String toString( ) |

Fig. 34F

| Scenario |
|---|
| Attributes |
| package double time = -1 |
| package double maxTime = Double.MAX_VALUE |
| Operations |
| public Scenario( )  3460 |
| public void init( ) |
| private void addAgent( Agent agent ) |
| public void extendedIinit( ) |
| public Agent getAgent( String id ) |
| public Agent[0..*] getAgents( ) |
| public Agent[0..*] getAgents( String pluginType ) |
| publicT[0..*] getAgents( Class<T>type ) |
| public Agent[0..*] getAgents( excludes ) |
| public void setMaxTime( double maxTime ) |
| public void setTime( double time ) |
| public double getTime( ) |
| public double getMaxTime( ) |

Fig. 34G

| Event |
|---|
| Attributes |
| package Double eventTimes[0..*] = new ArrayList<Double> () |
| package int executeNumber = -1 |
| Operations |
| public void executeEvents( double time ) |
| private boolean shouldExecute( ) |
| public void scheduleEvent( Event event ) |
| public void cancelEvent( Event event ) |
| public void reset( ) |
| public double getFirstEventTime( ) |
| public double getNextEventTime( double time ) |

| ExperimentalPanel |
|---|
| Attributes |
| package String eventType = ""<br>private ChangeEvent changeEvent = null<br>private EventListenerList listenerList = newEventListenerList() |
| Operations |
| package String getEventType( )<br>public Object get( String item, String requestor )<br>public boolean endConditionsMet( )<br>public void addChangeListener( ChangeListener cl )<br>public void removeChangeListener( ChangeListener cl)<br>protected void fireChangeEvent( String eventType ) |

| OutputPanel |
|---|
| Attributes |
| Operations |
| package void setTime( double time )<br>public void update( )<br>public void reset( boolean bool )<br>public void selectionChanged( )<br>public void animated( double time )<br>public void initialize( ) |

| PopPanel | |
|---|---|
| Attributes | 3530 |
| package double index = -1<br>package String title = " " | |
| Operations | |
| public void setTitle( String title )<br>public String getTitle( )<br>public int getDefaultWidth( )<br>public int getDefaultHeight( )<br>public void setIndex( double index )<br>public double getIndex( ) | |

Fig. 35D

| Writer | |
|---|---|
| Attributes | 3540 |
| package String fileName | |
| Operations | |
| package Writer( String_fileName, boolean delete )<br>public void append( String str )<br>public String getFileName( )<br>public void delete( )<br>public void deleteEntryByID( String id )<br>public String[0..*] getIDs( )<br>public String[0..*] getCandidtaeIDs( String id )<br>public String[0..*] getEntry( String id )<br>public ArrayList[0..*] getAllData( )<br>public boolean containsID( String id )<br>public String getTypeByID( String id ) | |

Fig. 35E

| ModelDialog |
|---|
| Attributes |
| package String dialogID = ""<br>package String toEdit = ""<br>package String eventType = ""<br>package String lasteventType = ""<br>package boolean wizardRunning = false<br>private EventListenerList listenerList = new EventListenerList()<br>package ChangeListener wizardListeners[0..*] = new ArrayList<ChangeListener>() |
| Operations |
| public ModelDialog( Frame frame )<br>public void setClassification( String str )<br>public void setDialogID( String dialogID )<br>public String getDialogID( )<br>public void showAdd( )<br>public void onOpen( )<br>public void showEdit( String toEdit )<br>public void load( String toEdit )<br>public ScenarioEntry getEntry( String id )<br>public void add( String entry )<br>public void close( )<br>public void cancel( )<br>public void delete( String id )<br>public boolean exists( String id )<br>public String getToEdit( )<br>public String getEventType( )<br>public String getLastEventType( )<br>public void setWizardRunning( boolean wizardRunning )<br>public boolean isWizardRunning( )<br>public void addChangeListener( ChangeListener cl )<br>public void addWizardListener( ChangeListener cl )<br>public void removeChangeListener( ChangeListener cl )<br>public void removeWizardListeners( )<br>protected void fireChangeEvent( String eventType )<br>public DefultTreeCellRenderer getTreeCellRenderer( ) |

MODULAR MODEL AND SIMULATION ARCHITECTURE

CROSS REFERENCE TO RELATED APPLICATION

Pursuant to 35 U.S.C. §119, the benefit of priority from provisional application 61/632,733, with a filing date of Jan. 24, 2012, is claimed for this non-provisional application.

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to computer modeling and simulation. In particular, the invention relates to program architecture for connecting modular independent elements of a modeling and simulation system for execution.

Computer simulation involves describing and executing a mathematical representation of a causality-based phenomenon, such as often encountered in physics or engineering. Often, such simulation includes creation of a model that idealizes or simplifies a response-driven avatar of an object under evaluation. Boundary and/or initial conditions can be imposed on the model to stimulate responses for evaluation, whether for transient or steady-state scenarios.

As computational ability has improved, modeling and simulation (M&S) techniques have expanded in complexity to include either more subtle detail and/or to incorporate more encompassing and interrelated processes. This has led to subdivision of coded information into instructions and data, nodal or elemental discretized response-models, library routines, event-triggering forcing functions, separate scenarios for simulation, testing and validation.

Discrete Event System Specification (DEVS) represents an example standard framework or formalism for interoperable modeling and distributed simulation applicable to discrete event systems. DEVS exploits separation between a model (responding object), an experimental frame (stimulating environment) and simulator (event driver) interacting by mathematical rules. DEVS has been used in the development of many diverse applications since its creation in 1976. The use of DEVS in military applications has become increasingly popular, particularly because event-based simulation can greatly decrease execution time.

In addition, DEVS simplifies development by identifying three major objects (or frames) that compose a system: the experimental frame, the simulator frame, and the model frame. DEVS exploits separation between a model (responding object), an experimental frame (stimulating environment) and simulator (event driver) interacting by mathematical rules. The DEVS framework supports automated integrated development and testing of integrated intricate systems. Further information can be obtained from B. P. Zeigler, H. Praehofer and T. G. Kim, *Theory of Modeling and Simulation*, 2/e, Academic Press©2000.

A modeling system under DEVS includes a temporal base, states, inputs, outputs and functions. Inputs can be arranged during arbitrarily spaced moments in time. Functions determine succeeding states and output in response to current states and inputs. DEVS includes three frames: model, simulator and experiment. The DEVS simulation concept includes a model and a simulator that exchange information across an interfacing protocol. DEVS identifies separation between a model (responding object), an experimental frame (stimulating environment) and simulator (event driver) interacting by mathematical rules.

SUMMARY

Conventional modeling and simulation (M&S) architecture yield disadvantages addressed by various exemplary embodiments of the present invention. In particular, various exemplary embodiments provide a computer-implemented modeling-and-simulation coordination module for coordinating components by exchanging and sequencing instructions. The module includes a scenario file generator, a plug-in loader, an interface loader, a module classifier, an event detector, a response initiator, a simulation processor, a model request processor, an instance receiver, and an output provider. The scenario file generator creates a blank scenario file. The plug-in loader for loading an available plurality of plug-in modules. The interface loader loads GUIs into corresponding containers. The classifier sets a classification to a highest rank plug-in module of the plurality of plug-in modules. The event detector monitors updating events. The response initiator for prompting the operator to select an experimental plug-in module from an available plurality of experimental plug-in modules. The simulation processor for executing a simulation in response to the operator loading a scenario, setting experimental parameters, selecting the simulator plug-in. The model request processor for providing parameters from the experimental frame to the model plug-in module. The instance receiver for receiving model instances from the model plug-in module. The output provider for disseminating display information based on time controls. The simulation processor instructs the simulator plug-in to execute instructions until satisfaction of terminal conditions and in response to initiation by the experimental plug-in module.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which:

FIG. 5A is a graphical interface view of an experimental frame selection window;

FIG. 5B is a block diagram view of a plug-in incorporation process;

FIG. 6 is a graphical interface view of a threat identification window,

FIGS. 7A and 7B are graphical interface views of an experimental window and an experimental frame;

FIG. 8 is a graphical interface view of an exemplary output plug-in;

FIG. 10 is a first graphical interface view of a global plug-in;

FIG. 11 is a second graphical interface view of a global plug-in;

FIG. 12 is a third graphical interface view of a global plug-in;

FIG. 13 is a fourth graphical interface view of a global plug-in;

FIGS. 14, 15, 16, 17, 18, 19, 20, 21, 22, 23, 24, 25, 26 and 27 are instruction set views of Java commands;

FIG. 28, is a graphical view of an output plug-in;

FIGS. 29 and 30 are instruction set views of Java commands;

FIGS. 32A, 32B, 32C, 32D, 32E, 32F and 32G are flowchart views of the Osm Executable;

FIGS. 33A, 33B, 33C, 33D, 33E and 33F are first flowchart views of the Osm Library;

FIGS. 34A, 34B, 34C, 34D, 34E, 34F, 34G and 34H are second flowchart views of the Osm Library; and FIGS. 35A, 35B, 35C, 35D, 35E and 35F are third flowchart views of the Osm Library.

DETAILED DESCRIPTION

Figure 1:
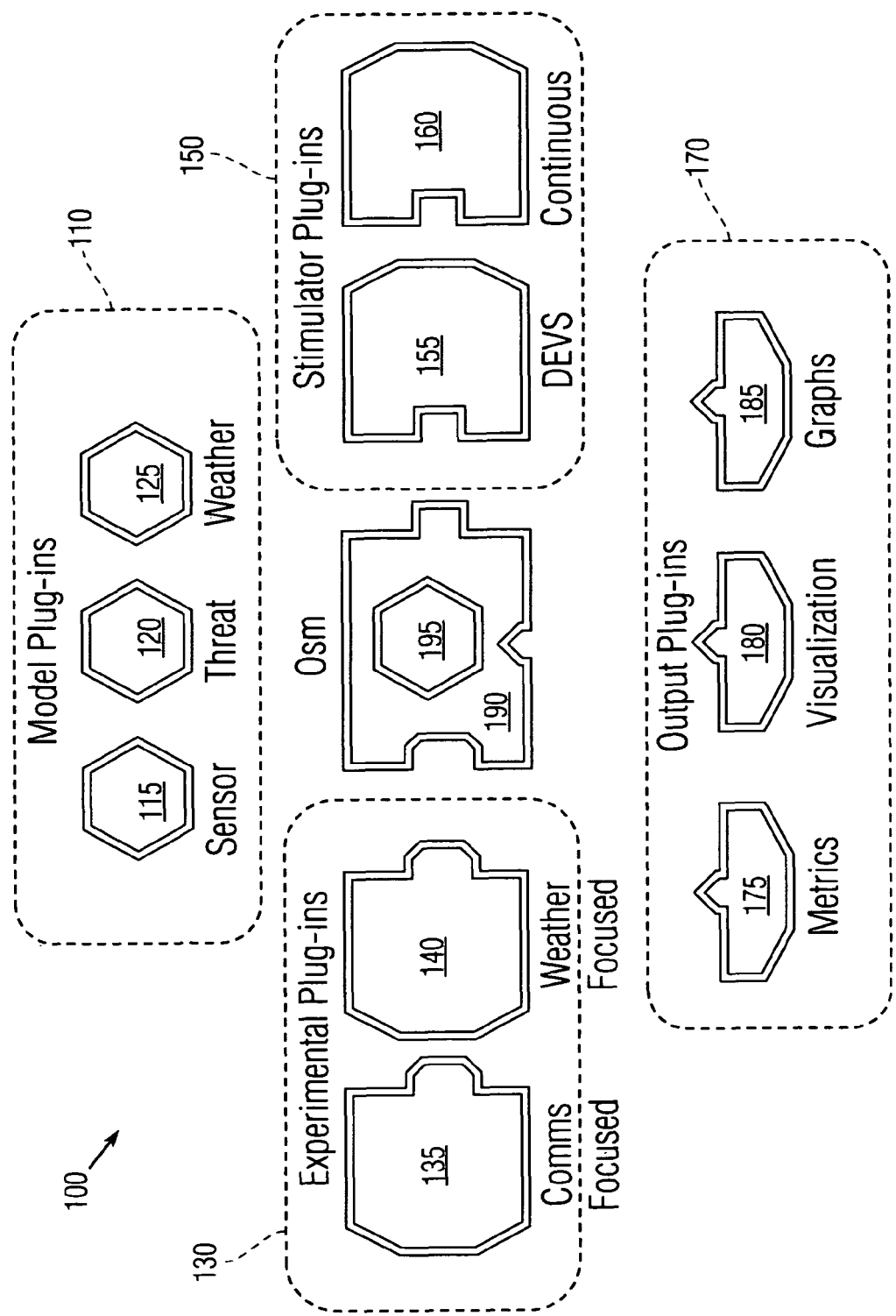
FIG. 1 is a first block diagram view of a M&S architecture.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, those of ordinary skill in the art will readily recognize that devices of a less general purpose nature, such as hardwired devices, or the like, may also be used without departing from the scope and spirit of the inventive concepts disclosed herewith. General purpose machines include devices that execute instruction cede. A hardwired device may constitute an application specific integrated circuit (ASIC) or a field programmable gate array (FPGA) or other related component.

Various exemplary embodiments enable modeling and simulation (M&S) frames along with output providers to be developed separately as plug-in modules by defining a communication protocol. These frames can be and preferably are produced in conformance to Discrete Event System Specification (DEVS). An entire M&S system can be created by adding, removing, and swapping these independently developed pieces. Various exemplary embodiments enable input plug-in modules (e.g., model, experimental), execution plug-in modules (e.g., simulator), and output plug-in modules to be developed separately and pieced together to form a system, facilitating development to be compartmentalized.

Modular simulation with independently created components can be treated as a plurality of frames with mutual interface connections. Various exemplary embodiments provide a coordinating module Orchestrated Simulation through Modeling called "Osm" (pronounced "awesome" as in "Awesome is as Osm does") that behaves as a conductor, defining rules for interaction that other participating components follow to render a performance or execute a simulation. These additional components can include frames or plug-in modules for models, experiments, outputs and simulations. Each of these modules may include or access libraries for further repository information.

In contrast to the orchestral arrangement of Osm, a conventional modeling and system "framework" can be analogized as a one-man band. There is one exception: basic models are defined within the framework, and model plug-in modules can be developed to provide more advanced versions of these basic agents. For example, a basic model of an airplane can be defined in a framework. A propeller-driven biplane model plug-in would extend the basic airplane model that is defined in the framework. Conventional M&S environments restrict event interactions, metric collections, etc, because this is all defined at the basic agent's level inside of the framework.

By design, the exemplary approach limits the traditional model plug-in module's ability to define its interactions with other models. Typically, open architectures include standards and protocols that enable models to be updated and/or added to the M&S system readily: plug-and-play. For M&S involving a limited number of models, the open architecture design centralizes information flow that eventually passes from one model to another. The cost for an element to participate in such an open architecture is usually commensurate with the burden of implementing associated models' standards and protocols of information exchange.

This imposition often becomes very difficult for M&S involving many elements; especially for elements with complicated inter-element interactions. Often, the composite burdens of these "centralized" protocols often preclude a systematic characterization of model to model interactions. Conventional M&S lacks a methodology that enables models to communicate directly with one-another while at the same time exchanging the right level of centralized information to the M&S system as a whole.

Osm provides a methodology that fills this M&S void by letting different aspects of the M&S models interact independently of the centralized aspect of the system while concurrently providing a simplified protocol of information exchange to the system as a whole. In other words, Osm enables the M&S to better emulate how models interact with each other and as a whole by allowing computer architectures the flexibility of imposing communication standards and protocols at a level that better reflects true interface information exchanges.

Osm represents a methodology that is intended to be constructed into a computer application. Furthermore, there is need for methodology to define how outputs, experimental frames, and simulator frames can actually be developed separately and combined to produce a scalable DEVS-compliant system. Much M&S effort becomes duplicated (often within the same organization), because this standard does not exist. There is an unfortunate absence of reusability in the M&S community, the deficiency of which exacerbates development time and money. The problem amounts to this: How can one build a simulation tool that leverages work from others instead of starting over every time? The Osm process provides standardization so that pieces can truly be developed separately and combined in a plug-and-play fashion.

Through Osm, DEVS frames and outputs can be written as plug-in modules in the same common language/protocol. The solution is scalable (models can be defined at different levels of detail, and anything can be modeled). Where conventional M&S software acts as a single musician or one-man-band, the Osm process performs as a conductor that directs musicians working together to form a symphony. Coordination between developers is simplified. Components become interchangeable. An entire system can be dramatically changed by adding, removing, and swapping DEVS frames and outputs. Osm obviates the necessity to write a whole new system when only a subset of frames or outputs needs to be changed. The conventional framework monopolizes all of the control of options. The Osm framework distributes this authority to the plug-in modules. This difference can be analogized to the contrast in early Internet access in the 1990s between America Online (later, AOL) and Netscape. AOL enabled access to a self-contained Internet community, whereas Netscape provided only a web browser with a communications protocol that enabled webpage content and chat-room exchange to be scripted and addressed independently. The Osm process defines how to separate the development of the DEVS frames and outputs through plug-in modules to enable maximum ability of reusability of such software components.

The Osm architecture provides a scalable protocol for rapid development of discrete event simulations that employs independent frame plug-in modules that can be separately composed. Various exemplary embodiments enable production of DEVS M&S frames to be separately developed as plug-in modules by defining a communication protocol, as well as creating output results independent of these modules. An entire M&S system can be created by adding, removing, and swapping these independently developed pieces. The architecture enables input plug-in modules (model, experimental), execution plug-in modules (simulator), and output plug-in modules to be developed separately and pieced together to form a system, facilitating development to be compartmentalized. The simulation framework can expand in complexity for a system of systems, as described by Robert K. Garrett Jr. et al. in "Managing the Interstitials, a System of Systems Framework Suited for the Ballistic Missile Defense System" (2009).

Figure 2:
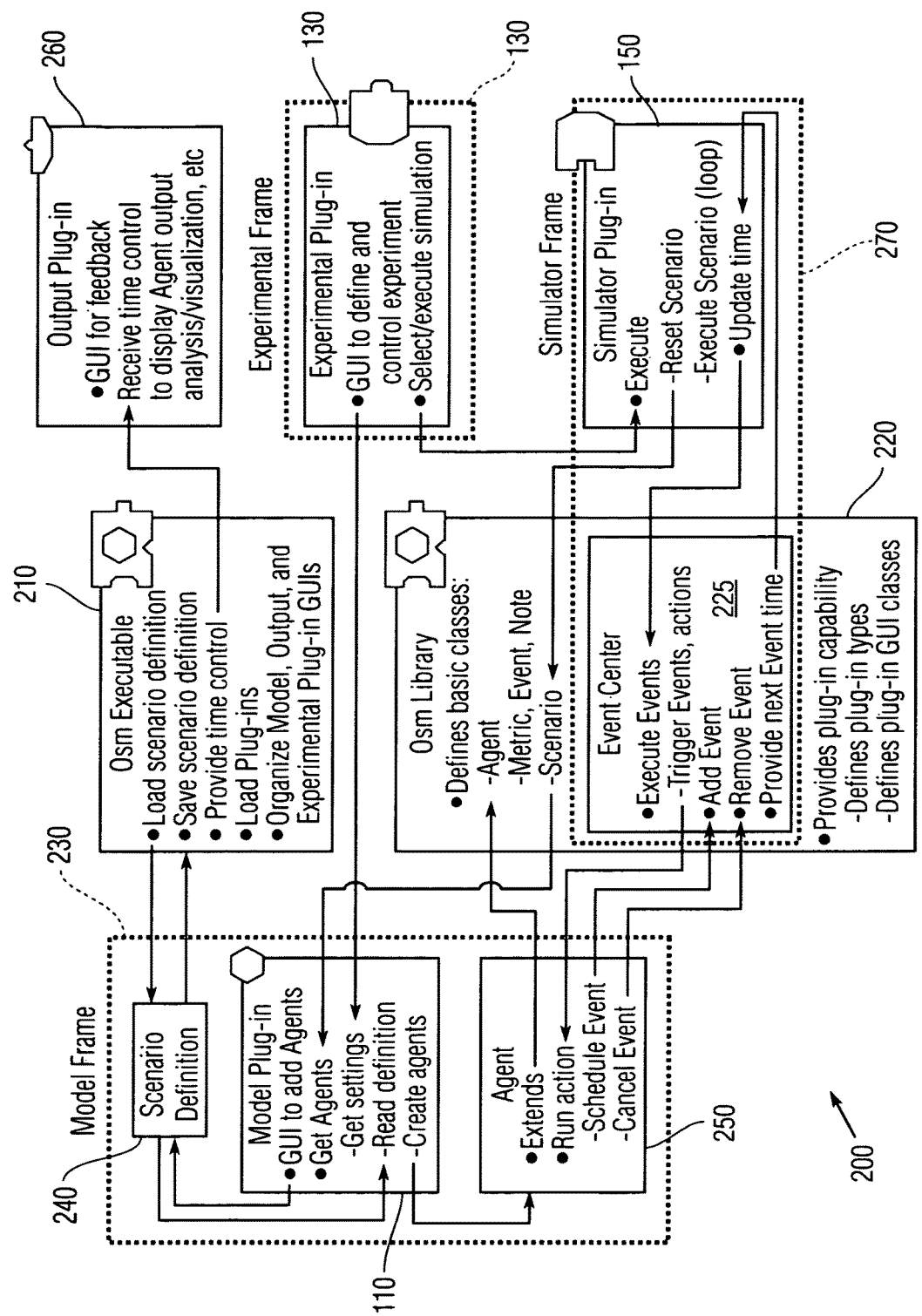
FIG. 2 is a second block diagram view of a M&S architecture.

A scenario represents a concert stage on which the simulation can be executed, analogous to an orchestral performance. Models represent Agents based on select quantifiable characteristics to operate under a defined simulation regime. Agents can be distinguished by actor Agents and object Agents. Analogous active Agents would include performance musicians, and complementary object Agents would constitute the musical instruments, subordinate to their actor Agent counterparts. The musician actor Agents could operate in accord with systemic instructions, such as sheet music for the instruments in an orchestral concert, as further coordinated by the conductor Osm. The Agents perform actions, typically in response to triggering stimuli denoted as temporal Events. Such actions can conditionally instantiate or cancel subsequent or contemporaneous Events, depending on the circumstances of the simulation. FIGS. 1 and 2 illustrate exemplary block diagrams of M&S architecture using Osm.

FIG. 1 shows a first block diagram 100 for M&S architecture using plug-in modules. An example model plug-in module 110 would be, for example, a sensor 115, threat 120 or weather 125 component. An experimental plug-in module 130 might include communications-based 135 and weather-based 140. The simulator algorithm in a simulator plug-in module 150 might include DEVS 155 and alternative continuous 160 formats. Results can be displayed using output plug-in modules 170, such as metrics 175, visualization 180 and graphs 185. A graphical user interface (GUI) represents an example type of visual display output format for the operator. These plug-in modules are coordinated by Osm 190, which includes an insertion envelope 195 for the model plug-in modules, as well as type-interchangeable connection ports for the experimental, simulator and output plug-in modules.

FIG. 2 shows a fourth block diagram 200 with the interactions of Osm 190 in conjunction with other modules. An Osm executable 210 issues various commands to plug-in modules in their associated frames, and receives parameter information from an Osm library 220, which includes an Event center 225. A model frame 230 includes a model plug-in module 110, as well as a scenario definition 240 and Agents 250 that extend the basic agent class defined in the Osm library 220. An output plug-in module 260 provides GUI feedback information and receives time control for feedback display from the. Osm executable 210.

A simulator frame 270 shares a simulator plug-in module 150 as well as the Event center 225. An experimental plug-in module 130 within an experimental frame 280 selects and executes simulation commands and issues instruction information to a simulator plug-in module 160 within the simulator frame 270. The model plug-in module 110 receives setting definitions from the experimental plug-in module 130 and definesAgents 250 using "get", "read" and "create" instructions, saved to and retrieved from a scenario file 550 (in FIG. 5). Creating an Agent 250 can include Events scheduling. The experimental plug-in module 230 also communicates with the simulator plug-in module 260 to update time for scenario execution for an Event center 225 to execute subsequent Events.

An over-simplified chess match can be exhibited as an example event-driven scenario amenable to model simulation. Chess involves a pair of players—white and black—that can move six types of pieces arranged on a square checker board having sixty-four tiles. As is well known, the pieces for each side include two rooks (R), two knights (N), two bishops (B), one queen (Q), one king (K) and eight pawns, each piece having defined movements. The objective of each player in the game is to declare "check-mate" by threatening inescapable capture of the opponent's king. Tile positions on the board can be described by columns (denoted by letters) and rows (denoted by numerals) that start from the lower left corner. At the beginning of a game (the initial condition), the pieces are arranged along rows adjacent opposing edges with opposing pawns facing each other.

In this example, white and black respectively represent initial and subsequent turn players of their respective pieces. Each player can move the color pieces assigned, but not an opposing piece except by capture and resulting seizure of that previously occupied tile. Both players and pieces constitute Agents. The player Agent is an actor that initiates events, whereas the piece Agent is an object that can only respond to a player's event. The board represents a stage on which the object Agents operate, definable by a scenario plug-in module.

The pieces move from one tile to another based on rules, such as being prohibited from shifting to a tile occupied or blocked by another piece of the same color, or to a tile occupied by an opposing color piece unless by capture.

Further, a library function can define the types of moves assigned to each piece as object Agent. For example, a pawn can only move one tile forward (away from its color's initial row edge) except for its first move optionally to proceed two tiles forward or diagonal capture of an opposing piece. As other examples, a bishop moves diagonally (forward and aft); a rook moves along its row or column (fore and aft); a queen can discretionally move as either a bishop or a rook.

Figure 3A:
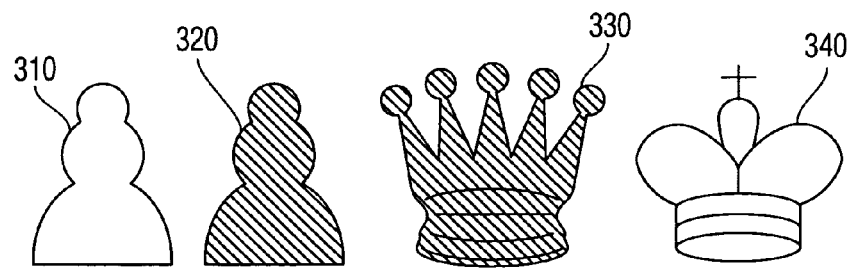
FIGS. 3A and 3B are graphical display views of an exemplary chess game simulation.
Figure 3B:
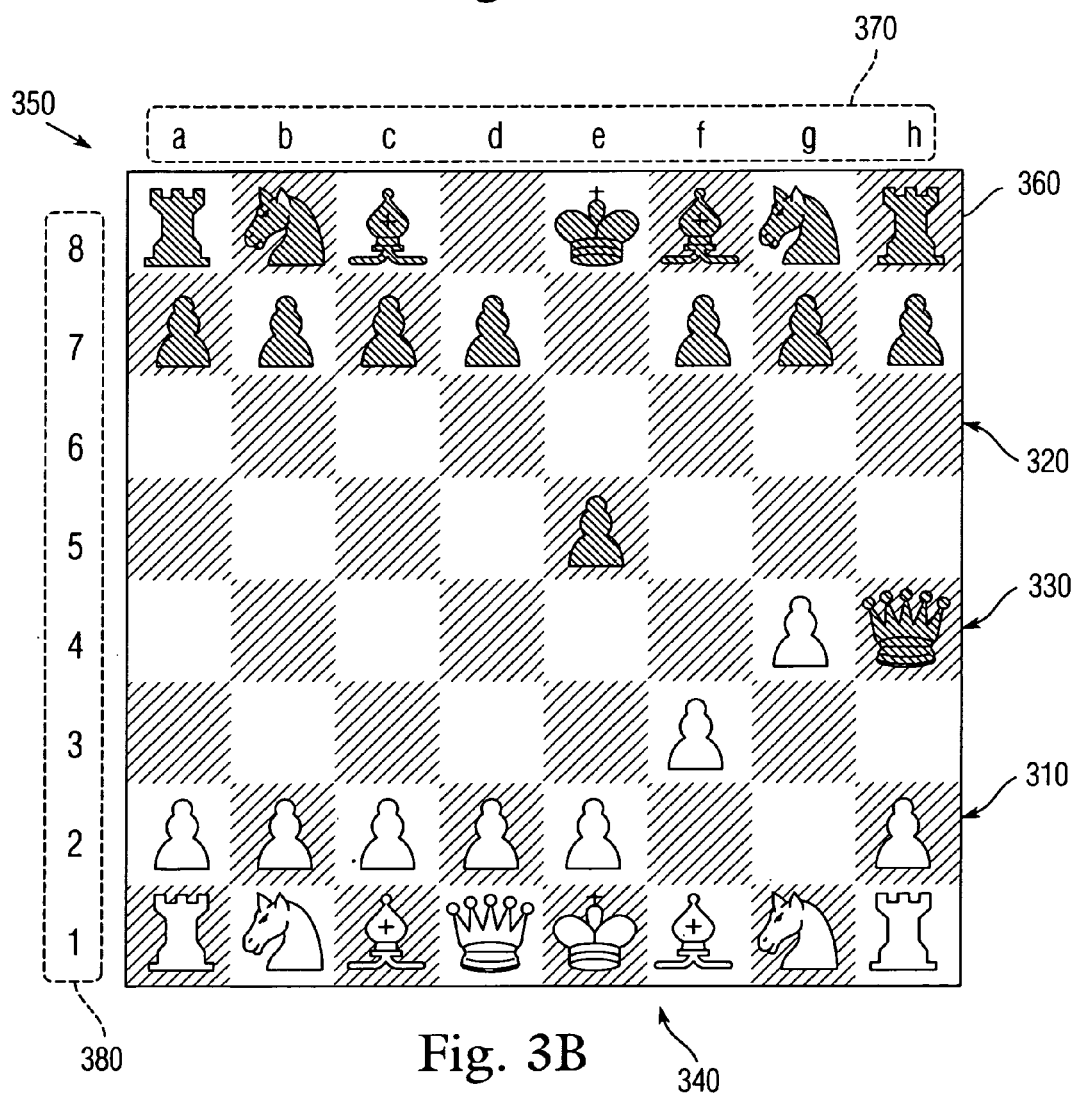

FIGS. 3A and 3B show schematic views of chess pieces and a board to represent interaction between Agents. In FIG. 3A, select chess pieces 300 are displayed: white pawn 310, black pawn 320, black queen 330 and white king 340. In FIG. 3B, an exemplary game scenario 350 is displayed at its conclusion. The final arrangement of the pieces for a series of moves known as "fool's mate" is shown on a chess board 360, with columns 370 and rows 380 identified adjacent the edges to identify discrete coordinate positions for the pieces. The columns 370 are designated by lowercase letters "a", "b", . . . etc., whereas the rows 380 are designated by numerals "1", "2", . . . etc. The chess board 360 can be visually displayed by a GUI for benefit of the observer.

In typical notation, each turn is denoted by a numeral followed by position changes by the consecutive white and black players. The move of each player triggers a counter-move by the opposing player until no further moves are possible (or both agree to a draw) This represents an Event-driven scenario in which each turn has consecutive first and second Events, and the second Event of that turn initiates the next turn. Each move of a piece is indicated by the piece's uppercase letter, followed by the coordinate of the destination tile. For example, Be5 (move a bishop to e5), Nf3 (move a knight to f3), c5 (move a pawn to c5, pawns denoted without a piece letter). Seizure of a tile occupied by an opposing piece indicates its capture. For the scenario 350 shown, the board 360 depicts the white king 340 threatened by the black queen 330 as a consequence of positions of the white and black pawns 310 and 320. The relevant two-turn notation for fool's mate can be indicated for the Events in each turn as: 1. g4 e5 2. f3 Qh4 (mate).

As provided by exemplary embodiments, code for the Osm library 220 and executable 210 remain the same irrespective of which plug-in modules are employed. To create chess software with Osm 190 involves a set of plug-in modules described as follows:

chess player model plug-in to create players and their pieces;
board output plug-in to provide visualization of the executed simulation to the player;
simulator plug-in that provides a turn-based simulation algorithm; and
experimental plug-in to select the simulator plug-in and provide an audience variable (player performance being potentially influenced by known presence of witnesses).

In Chess, the Agent types would be king, queen, knight, bishop, rook, pawn, and player. A model plug-in of type "chess player" might define an actor Agent as follows: identifier number, skill level, color (white or black), number of each object Agent, and beginning board position for each object Agent. Note that the object Agent can be described as a child Agent subordinate to the actor Agent. The GUI for such a model plug-in can enable the operator to define each player.

Figure 4:
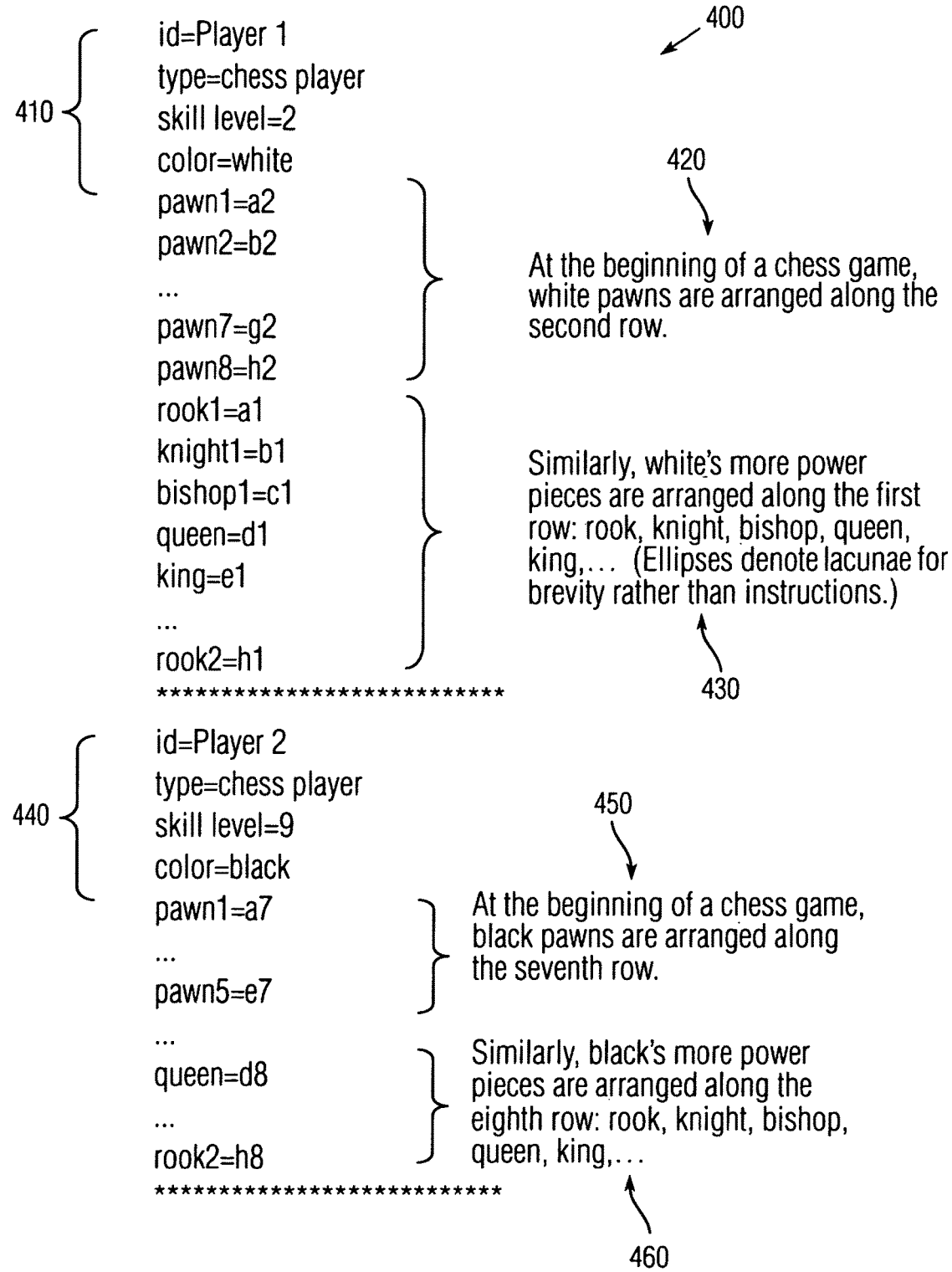
FIG. 4 is an instruction set view of Agent data for the chess game simulation.

The Scenario Definition file created by such a plug-in module (with two entries) might resemble, as shown in FIG. 4, the instruction list 400. The actor Agent identification for the first player 410 provides parameters relevant to the scenario. Initial positions of pieces on the board 360 for the first player 410 can be listed beginning with the pawns 420 on the second row and followed by the ranking pieces 430 on the first row. The actor Agent identification for the second player 440 provides complementary information associated with the chess game. Initial positions of pieces on the board for the second player can be listed with the pawns 450 on the seventh row and the ranking pieces 460 on the eighth row. For both players 410 and 440, distinguished by color, the pieces are identified by their respective row and column tile on the board 360 at the start of the game.

Through the Osm executable 210, these entries can be saved to a file and reloaded later. The experimental plug-in 130 can provide a global "audience" variable, which the model plug-in 110 would request for each entry when creating Agents 250 from the Scenario Definition 240. When creating the Agents 250, the "chess player" model plug-in would request the "audience" from the experimental plug-in 130. This can be done through a "get" method in the experimental plug-in that enables as input an identifying word and the requestor. For instance, the model plug-in could state:

int audience=experiment.get("audience", "chess player");

which returns an Object of type int. This enables environmental influences to be independently imposed onto actor Agents in this example.

Upon completion of defining the Agent characteristics in the model plug-in 110, the simulator plug-in 150 can be selected and then executed by the experimental plug-in 130. A first Event begins the game. During the first turn, the first player 410 moves, e.g., pawn7 at g2 to g4, which schedules the opponent to perform the second turn as a second Event by the simulation algorithm for the second player 440 to move, e.g., pawn5 at e7 to e5. This completes the first turn, which initiates a third Event beginning the second turn by the simulation algorithm. The first player 410 moves, e.g., pawn6 at f2 to f3 and triggering a fourth Event. In response, the second player 440 moves, e.g., queen at d8 to h4. The white king 340 becomes trapped, being subject to capture by the black queen 330 and unable to block or escape, resulting in check-mate. This final move terminates further turns (and thereby any subsequent events), and the game concludes with the black player 440 victorious. Artisans of ordinary skill will recognize that such a simplified example can be readily expanded to war-game simulation and to other conditional Event-triggered modeling scenarios.

FIG. 5A shows a model plug-in a graphic interface plug-in 500 that is used to define interceptor model entries. The interface plug-in 500 presents an Agent window for the identification 510 of Aegis Ballistic Missile Defense (BMD). Latitude and longitude for launch and other parameters are quantified in dialog boxes 520. Conclusion buttons for acceptance "OK" 530 and Cancel terminates this interface for a subsequent or preceding operation.

Figure 5C:
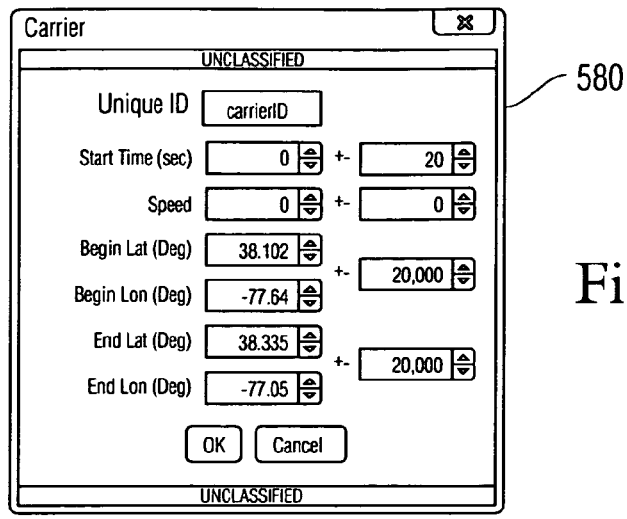
FIG. 5C is a graphical interface view of a carrier window.

FIG. 5B illustrates a process 540 that incorporates the plug-in 500. In response to pressing the OK button 530, the information from the graphical interface is written to a scenario file 550 as an at operation for incorporating previously written software. If the data for a model instance are to be edited, the load operation 555 reads the data for the specified instance and loads them back into the graphic interface. If the OK button 530 is pressed again with the data to be edited, the add operation overwrites the data to be edited. The getAgents operation 560 is in charge of searching through the scenario file 550 and finding all instances of the model plug-in module's specified type. For each entry, a retrieve and create operation 570 then creates Agents 250 from each entry and returns all of the Agents. Alternatively, implementing models from existing software involves an Agent creating a child Agent during execution. For instance, a launcher Agent might create an interceptor Agent through an optional black box 575 at the appropriate time in the simulation based on a particular threat. FIG. 5C shows another example interface 580 described further in subsequent paragraphs.

FIG. 6 presents a threat identification plug-in user interface 600 that is used to define threat model entries: An identification dialog box 610 labeled Raid 1 identifies parameters 620 for quantifying time and altitude, as well as range. Geographical region 630 can be selected from a menu list. Conclusion buttons for acceptance (OK) 640 and cancel terminates this interface for a subsequent or preceding operation.

FIGS. 7A and 7B show example experimental frame interfaces 700. A basic experimental frame interface 710 can be generated by pressing the OK button 640 from the threat identification interface 600. A threat selection experimental frame 720 displays similar characteristics related to the threat model interface 600.

Figure 8:
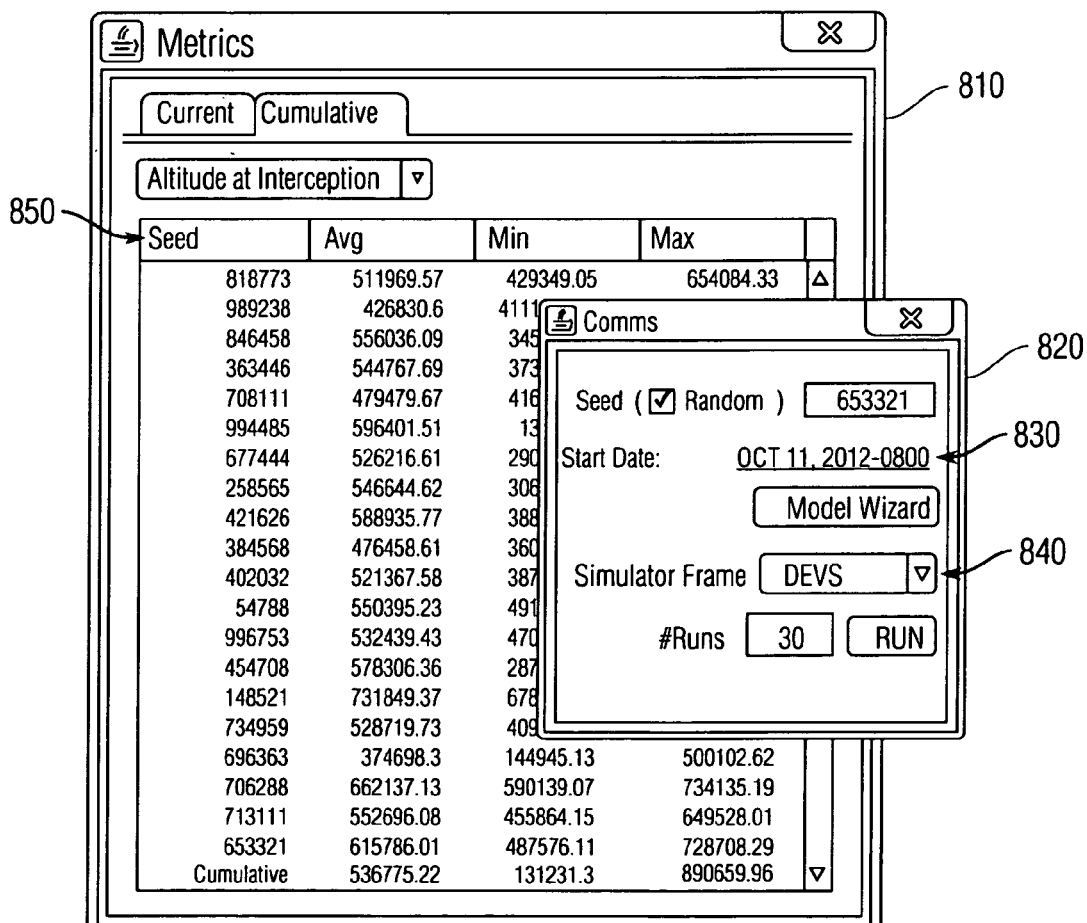

FIG. 8 illustrates an output plug-in (Metrics) 810 interacting with the selected experimental frame (Comms) 820. The experimental frame 820 is very straightforward and only has one global Agent variable (Start Date) 830, and also enables selection of a simulator frame, such as DEVS 840. Agent Metrics that have been collected during execution are displayed in the output plug-in 260 with Seed 850, so the operator may repeat the experiment by manually entering the seed of interest back into the experimental frame and executing once.

Figure 9:
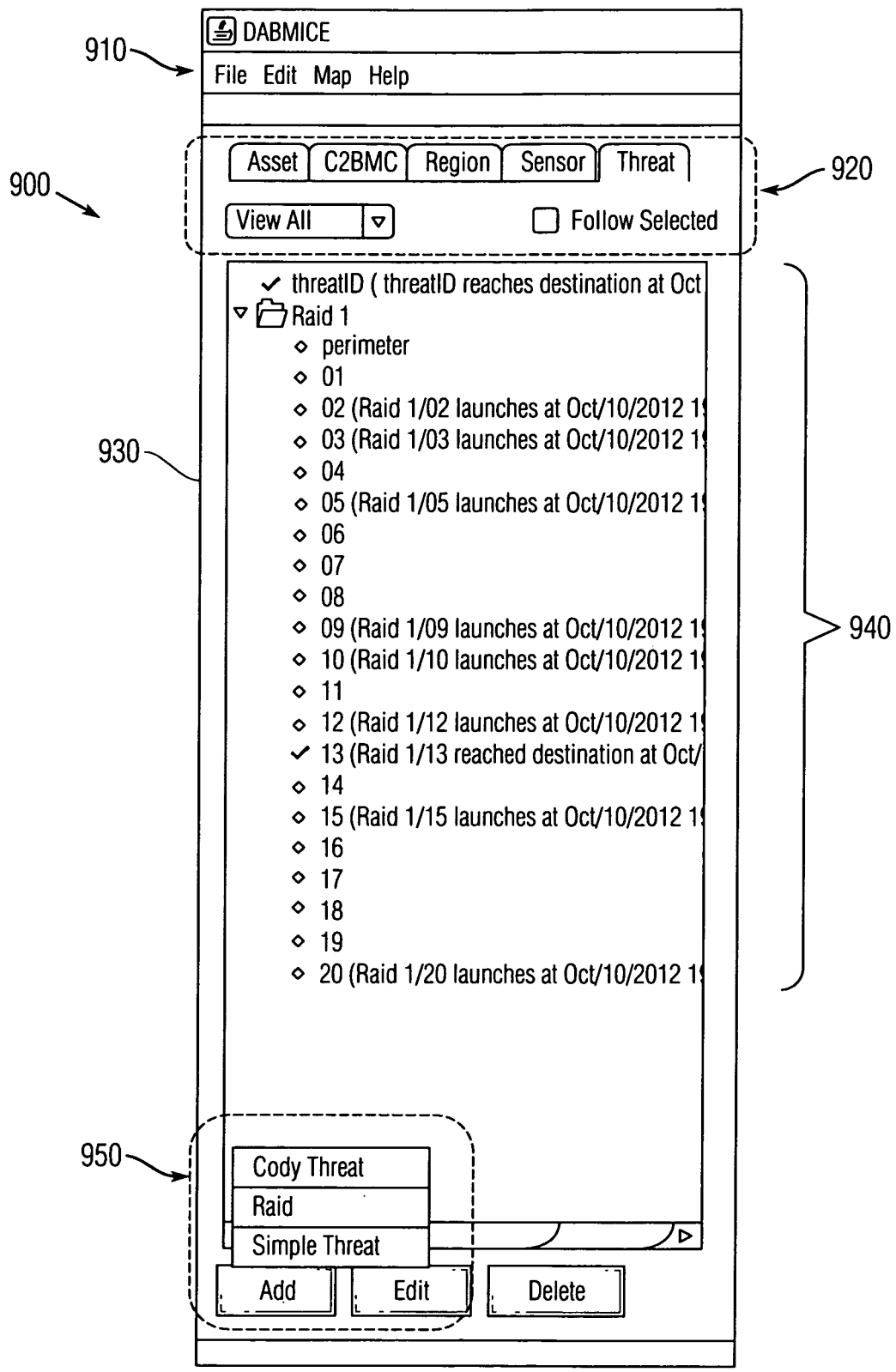
FIG. 9 is a graphical interface view of a threat identification events list.

FIG. 9 shows an interface 900 for threat identification. The GUI includes a file menu 910, an Agent selection 920, a data window 930 with a list 940 for Raid 1, which was populated by the operator upon selecting the add feature 950 and completion by the operator of the GUI inputs. The interface 900 presents model plug-in identifications that can open graphical interfaces for adding model instances. In this example, there are three model plug-in modules 110 of type "Threat" (Cody Threat, Raid, and Simple Threat) in the add feature 950.

The Osm executable 210 populates the "add" buttons with plug-in identifications that instantiate their respective user interfaces and incorporate their entries to the add feature 950. In this example, the three plug-in options define themselves under the "Threat" type. As described for FIG. 5A, the identification is displayed in a dialog box 510, with quantitatively selectable times and parameters 520. In response to clicking the "add" button in the feature 950, a list of "Threat" plug-in modules is displayed in the list 940. For a scenario in which the operator selects the "Raid" plug-in module, the consequence introduces a subsequent plug-in module graphical interface 600 in FIG. 6 as a pop-up feature.

Figure 10:
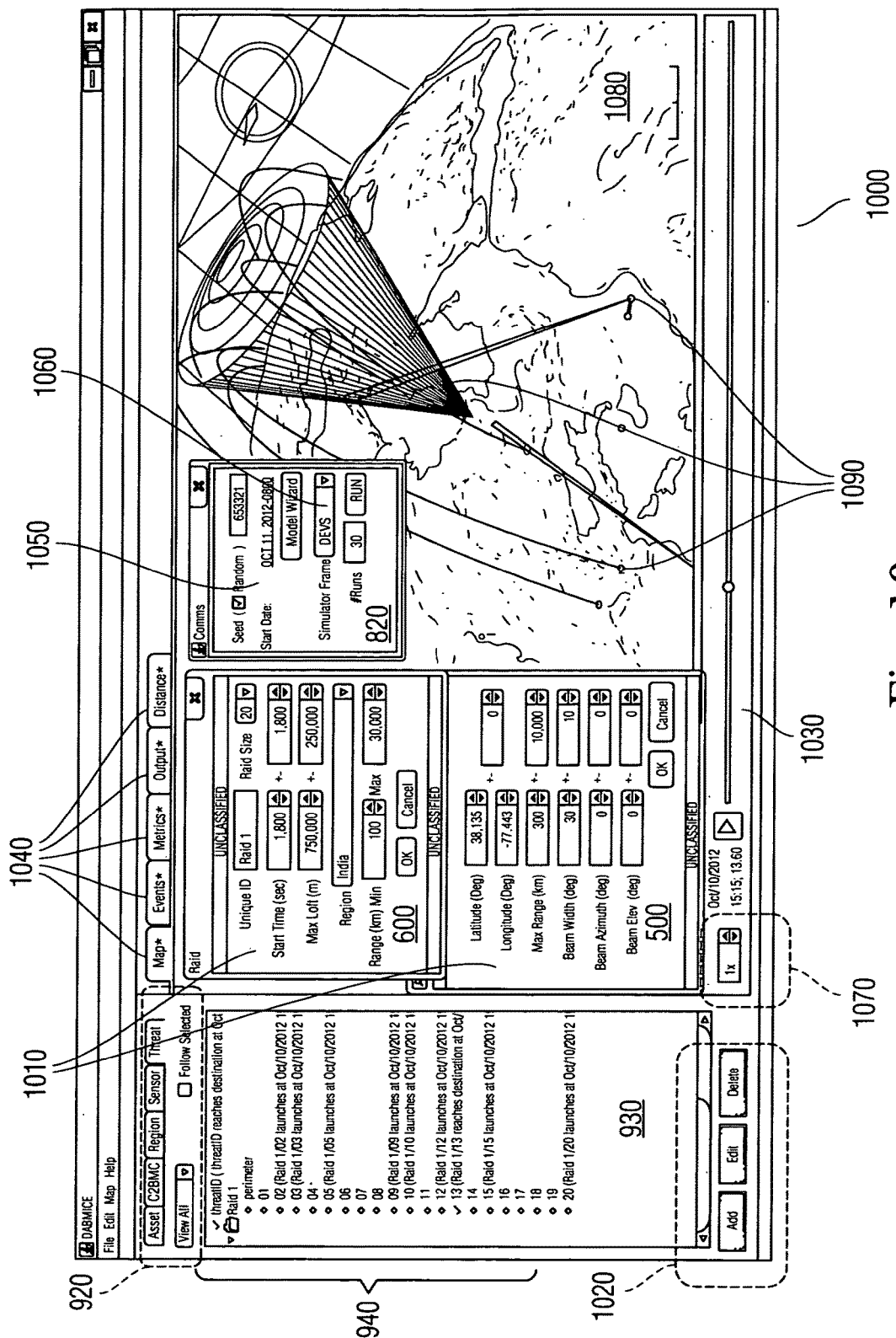

FIG. 10 shows a first Cam project 1000 with global plug-in windows, including model plug-in interfaces 1010, such as model scenario file 500 and threat scenario file 600. The threat identification interface displays the menu 920, data window 930 with list 940 and a button selection 1020 for proceeding with the add feature 950. The button selection 1020 includes an "add" option for opening and populating the dialog entries, an "edit" option for replacing prior entries, and a "delete" option to terminate that plug-in Interface. The GUI 1000 also displays a time slider 1030 for playback, a menu 1040 for output plug-in interfaces 170, an experimental plug-in interface 1050 featuring a selectable simulator plug-in (such as the DEVS frame 840), a time speed control 1070, and a geographical map plug-in 1080. This exemplary map displays the eastern Mediterranean Sea with the Persian Gulf on the horizon with specific model tracks displayed 1090 for missile defense simulation.

Figure 11:
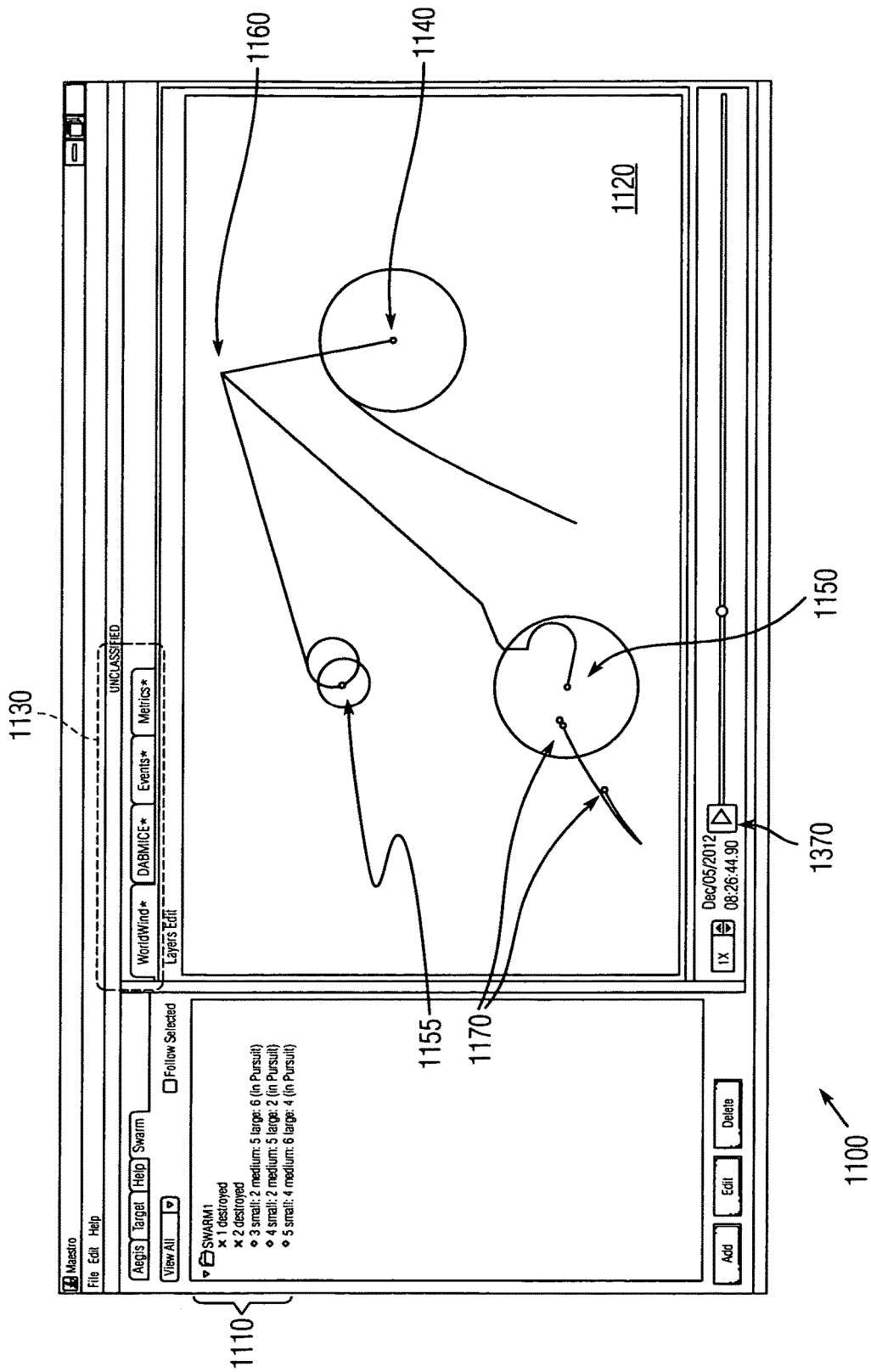

FIG. 11 shows a second Osm project 1100 with global plug-in windows for a swarm event list 1110 and a local map 1120 shown in conjunction with a menu 1130 and the time slider 1030. A naval ship 1140 launches first and second helicopters 1150 and 1155 from a rendezvous location 1160 to patrol for bogeys 1170. On their way to patrol, the first helicopter 1140 discovers some bogeys 1170 and attacks them. At the stage displayed, two waves in the swarm are shown destroyed.

Figure 12:
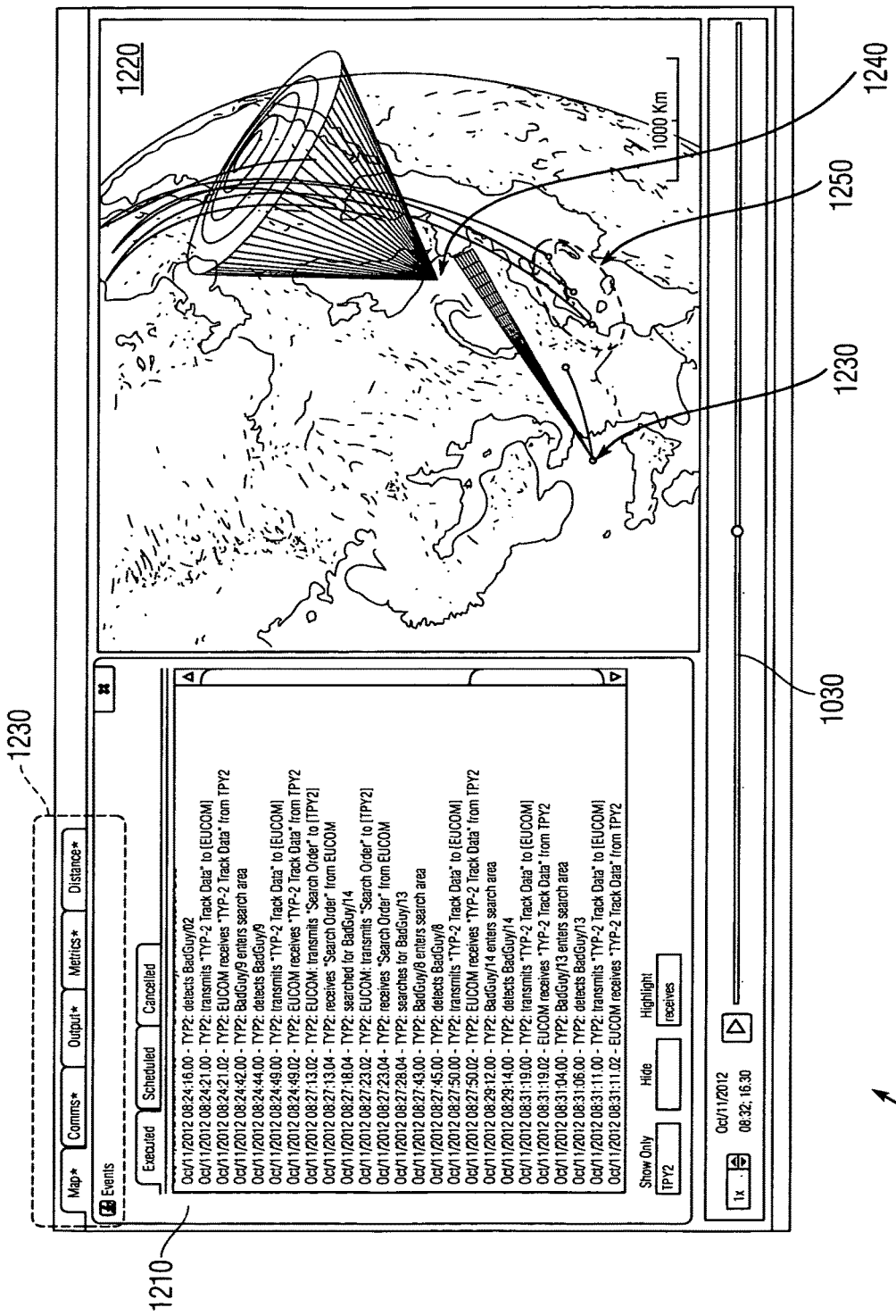

FIG. 12 shows a third Osm project 1200 to display access Events 1210 and a global map 1220 as output modules. The Events 1210 can be displayed to list those that have been executed, scheduled and cancelled for analysis purposes. The map 1220 (showing Scandinavia to the left with the Sahara Desert on the horizon) graphically displays the results from the Events in relation to the globe and constitutes an output plug-in 260. Both of these output plug-in modules 1210 and 1220 interact with the time slider 1030, so data are displayed for a specific time during the simulation. Menu tabs 1230 provide additional display control. The global map 1220 includes a TPY-2 radar 1240 projecting southeast from the North Sea, a satellite track 1250 scanning the Arabian Peninsula and target positions 1260 in Italy.

Figure 13:
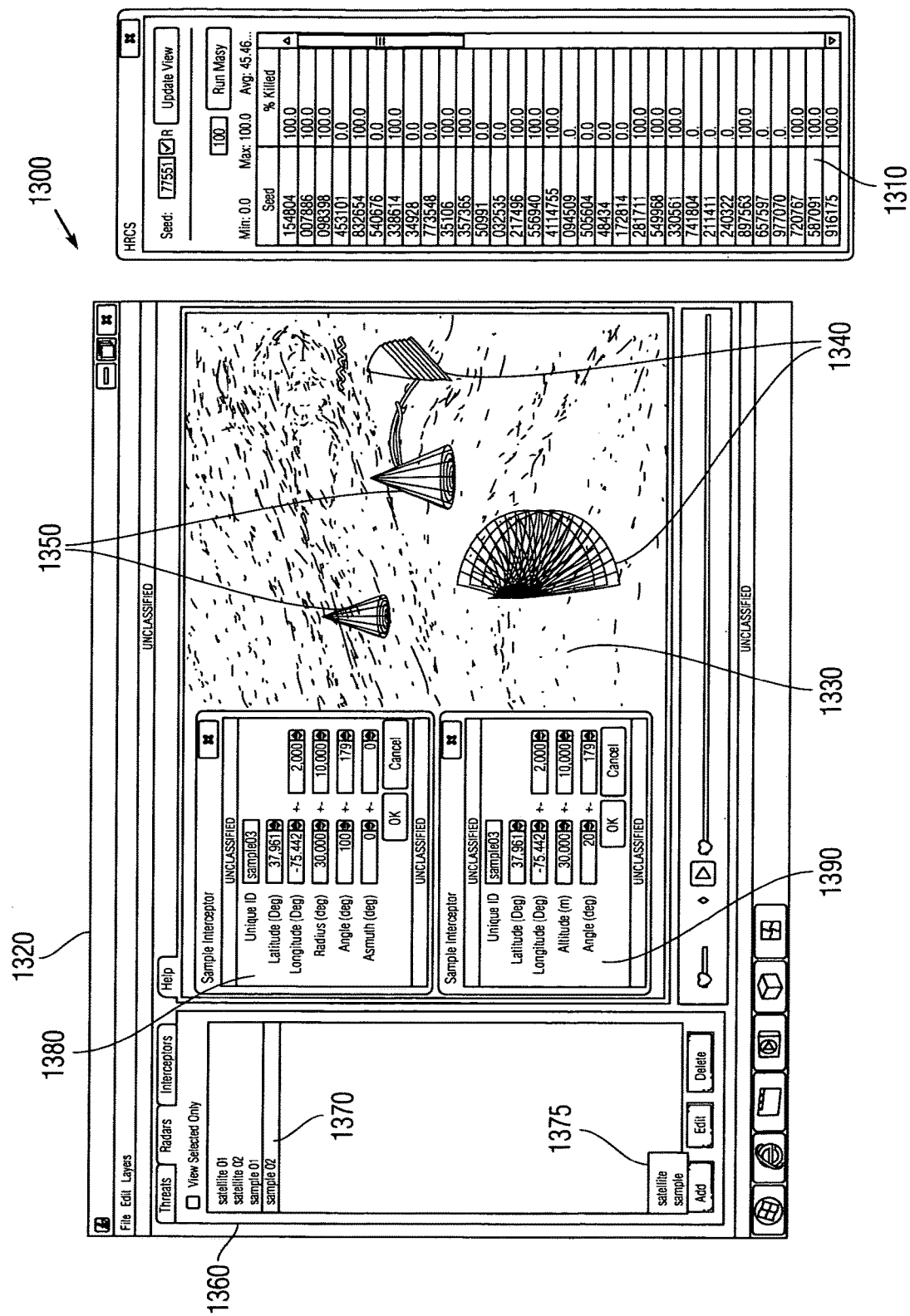

FIG. 13 shows a fourth Osm project 1300 to display an experimental frame display 1310 and an output map window 1320. The experimental frame 1310 lists random seed integer and corresponding percent-killed for an execution run. An output plug-in 1330 displays a topographical landscape with iconic instances of ground-based radar sweeping 1340 and instances of satellite imaging 1350. The map window 1320 also shows a selection window 1360 with lists of models 1370 for created radar information, a first model plug-in interface 1380 to add or edit a simple radar data and a second graphical interface 1390 to add or edit satellite data.

FIG. 14 shows the first portion of an exemplary code 1400 to create an Agent class. This package includes import data 1410, parameter definition 1420, constructor definition 1430, values initialization 1440 and experimental plug-in receipt 1450. FIG. 15 shows the second portion of an exemplary code 1500 to create an Agent class. This package includes scheduling a first move event 1510, movement quantification 1520, distance calculation 1530 and metric collection 1540. In this example, a "Cartier" starts at a first location and ends at a second location. The example recursively schedules an Osm Event to move the Carrier until reaching its destination. Once complete, the code collects a Metric until time of arrival. The Agent class should be provided a unique name. Preferably the operator should incorporate the project name for which the Agent class is intended to ensure uniqueness across other operations.

FIG. 16 shows an exemplary code 1600 for creating model plug-in dialog for a carrier. This package includes carrier frame constructor 1610, initialization 1620 and carrier parameter value initialization 1630. The first operation creates a ModelDialog (defined in Osm 190), which extends JDialog (defined in Java). One can produce the form in any manner intended, with the goal to enable an operator to create Agent instances. In this example for the Agent 250 shown previously, a constructor that requires each Carrier to have identification, a start time, a speed, a beginning location, and an ending location. As such, all of that information is available in the form shown in the plug-in 580 in FIG. 5C.

In addition, there are some variables for randomization thresholds. The Dialog class must be provided a unique designation. Such incorporation for the project name ensures uniqueness. The first part of code 570 is needed to create a dialog such as shown in block diagram 540 in FIG. 5B.

FIG. 17 shows an exemplary code 1700 for setting classification, such as by classification 1710 of the setring set. The Osm library 220 (OsmLib) has a ClassificationBar object, as seen in the example dialog image. For such incorporation, one should override the setClassification process as indicated.

FIG. 18 shows an exemplary code 1800 for writing an instance to the scenario file 240. This package includes unique identification verification 1810, code to delete old instance 1820 (if editing), a read list of parameters 1830 for the "threat" string in order at 1840 to write the string to the scenario file 240, enabling development of a model plug-in dialog. When the operator presses the "OK" button 530, this code creates an entry for the scenario file 550.

FIG. 19 shows an exemplary code 1900 for loading an entry from a Scenario Definition file 550. The package includes getting the entry 1910 from the scenario file 240 and populating the user dialog 1920. When the operator presses the "edit" button in the menu 1020 while selecting a model instance in the Osm executable 210 (OsmEXE), this load (String id) process is called. The operator can obtain an entry based on the identification parameter provided and populate the ModelDialog with that entry.

FIG. 20 shows an exemplary code 2000 for implementing a class into an Agent plug-in 250 for an example carrier. The package includes import of model plug-ins 2010 and a get command 2020 for that carrier model plug-in. The model plug-in modules 110 for Osm 190 expect a class that implements IAgentPlugin for such incorporation. The IAgentPlugin class should preferably be uniquely named, as with other classes created for Osm 190. The Dialog class must also be unique, and preferably a developer can incorporate the project name to ensure uniqueness. FIG. 21 shows an exemplary code 2100 for assigning a getType class. The package includes a "get" instruction 2110 for model type, classification identification 2120, a package for output plug-ins on request 2130, a dialog parent identifying method 2140 and a dialog request 2150. FIG. 22 shows an exemplary code 2200 for assigning a getAgent method. The package includes a command 2210 to get an Agent definition from the scenario file 550, parameter calculations 2220, and a carriers "add" instruction 2230.

FIG. 23 shows an exemplary code 2300 for creating an experimental panel. The package includes a command to populate a simulator plug-in selector 2310, a simulation execution command 2320, a command to set a random seed 2330, and a command to initialize and execute the scenario 2340. See the dialog box 710 in FIG. 7A. In this example, code can be written that is specific to designing and interacting with a Java Swing GUI. That code is omitted for readability purposes. With the approach defined in exemplary embodiments, multiple experimental frames can be loaded as plug-ins at startup and then selected by the operator. Each experimental plug-in 130 can change the entire purpose of the system. The model plug-ins 110 request values defined within the selected experimental plug-in 130. This is implemented as follows: a model plug-in 110 uses the get(<word>, id) process of the experimental plug-in 130. If the word is "seed", then the experimental frame 280 recognizes that a seed has been requested. The identifier id defines the requestor (two requestors may be asking for something completely different when they request "seed", so the experimental frame can handle the two identical queries differently).

FIG. 24 shows a first portion of an exemplary code 2400 for creating an experimental plug-in class. The package includes a time initialization query 2410, an information request 2420 for Agents 250, and default parameters as needed 2430. The request 2420 returns an Object as requested by the model plug-in 110, which uses that Object in any manner instructed. This experiment's purpose is very simple: execute the simulation. The experiment defines the purpose of the experiment (e.g., analysis, war gaming). In this example, the Agents 250 can request a random integer from the experiment. To create the Basic Experiment as the dialog box 590, an ExperimentalPanel and an ExperimentalPlugin would be needed.

In this example, the operator can set up the experiment by setting the following:
 Seed: used for randomization;
 Max seconds: simulation time before quitting;
 Model wizard button: create model instances through a wizard;
 Simulator frame selector: select the simulator plug-in 150;
 Run button: enable the operator to execute the simulation.

FIG. 25 shows a second portion of an exemplary code 2500 for creating an experimental plug-in class. The package includes scenario queries 2510 for identification, classification and type, a panel return 2520 for the experimental frame's user interface, an execution command 2530 for the scenario, a scenario requester 2540, and a check 2550 to determine if the simulation's terminal conditions are satisfied.

FIG. 26 shows an exemplary code 2600 for creating a simulator plug-in class. The package includes an import selection 2610, an identification method 2620, a simulator type method 2630, a class definition 2640, and a set-time method 2650 used for real-time simulations. FIG. 27 shows an exemplary code 2700 for executing the simulation and producing an output plug-in. The package includes defining the agents 2710, a command 2720 to execute the DEVS algorithm, and a command 2730 to retrieve a scenario.

There are sundry arrangements in which data can be displayed in a meaningful format. With output plug-ins 260, any data can be displayed in any manner desired. Output plug-in modules have access to all of the Agents in a Scenario. The Osm executable's time control sends its current value to each output plug-in as the chronology updates. The output plug-ins 260 can react in any manner desired, and they can interrogate the Metrics, Events, Notes, and any other data that are easily accessible for each Agent 250. There is no limit to the manner in which information can be visualized.

FIG. 28 shows an output plug-in 2800 as a simple example, and this interface shows the capability of Osm 190. The plug-in prints out all of the metrics that have been collected up to the Osm executable's time control value. If the time control is increased, more Metrics are visualized because more have been collected at that point. There are two things needed to create this plug-in: OutputPanel and OutputPlugin classes. The output shows a list 2810 of carriers with arrival times (similar to the list 1110 in FIG. 11), along with the speed selector 1070 and time slider indicator 1030.

FIG. 29 shows an exemplary code 2900 for an example OutputPanel class. The package includes imports 2910, an output panel extension 2920, an initialization command 2930, an update command 2940 for the Osm executable 210 to inform the output that the scenario has been changed, agent metric viewing 2950, as well as default settings 2960 and 2970.

Figure 30:
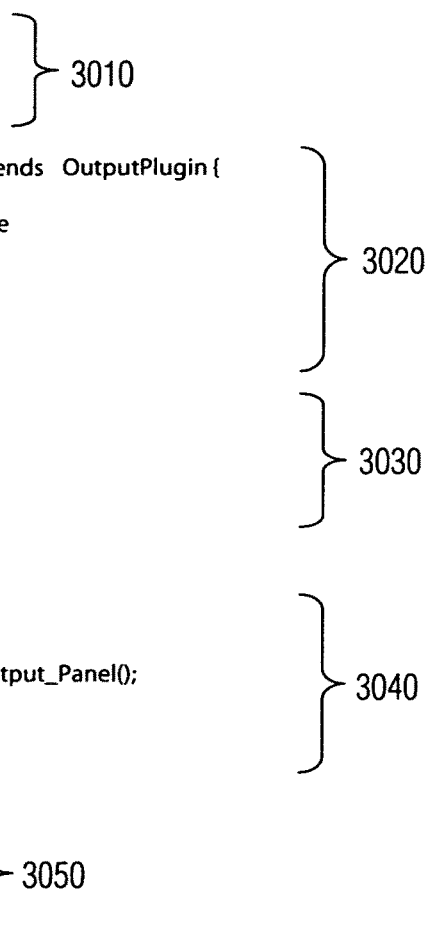

FIG. 30 shows an exemplary code 3000 for an example OutputPlugin class. The package includes imports 3010, an output plug-in instantiation 3020, a string classification 3030, an output panel return command 3040, and an output tab preferred location 3050.

Figure 31:
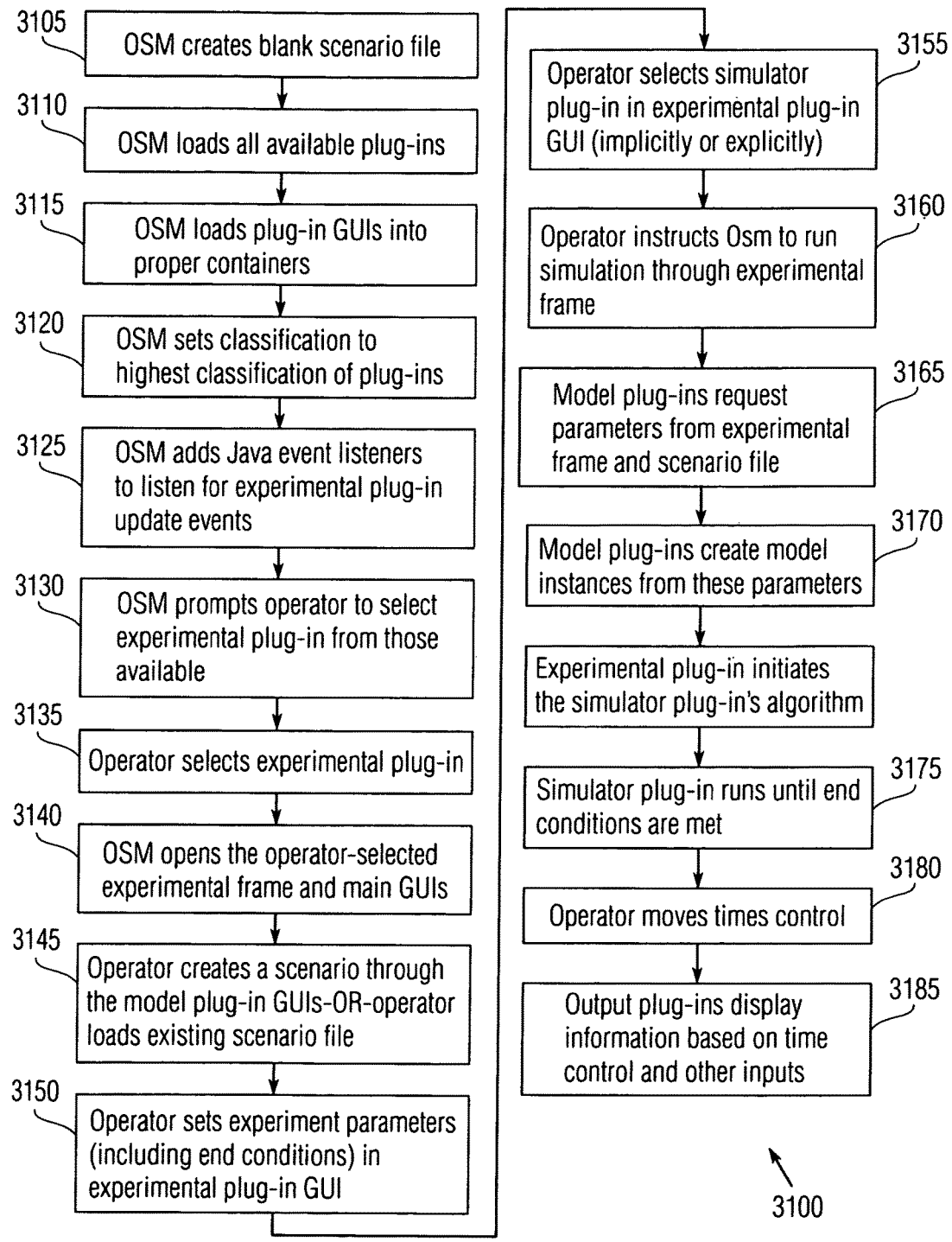
FIG. 31 is a flowchart view of Osm process instructions.

FIG. 31 shows an exemplary flowchart view 3100 of the operational sequence for Osm 190 operation. In step 3105, Osm 190 creates a blank scenario file 240. In step 3110, Osm 190 loads all available plug-in modules. In step 3115, Osm 190 loads plug-in GUIs into proper containers. In step 3120, Osm 190 sets classification to the highest classification of plug-in modules. In step 3125, Osm 190 adds Java event listeners to monitor experimental plug-in modules 130. In step 3130, Osm 190 prompts the operator to select an experimental plug-in module from those available. In step 3135, the operator selects the experimental plug-in module. In step 3140, Osm 190 opens the operator-selected experimental frame GUI and main GUI.

In step 3145, the operator creates a scenario through the model plug-in GUIs, or alternatively the operator loads an existing scenario file 240. In step 3150, the operator sets experimental parameters (including end conditions) in the experimental plug-in GUI 130 within the experimental frame 280. In step 3155, the operator selects a simulator plug-in module 150 in the experimental plug-in GUI (implicitly or explicitly). In step 3160, the operator instructs Osm 190 to execute simulation through the experimental frame. In step 3165, model plug-in modules 110 request parameters from the experimental frame 280 and the scenario file 240. In step 3170, model plug-in modules 110 create model instances from these input parameters. In step 3175, the experimental plug-in module 130 initiates the simulator plug-in's algorithm. In step 3180, the simulator plug-in modules 150 execute until final conditions are satisfied. In step 3185, the operator moves the time control. In step 3190, Osm 190 sends time control data to output plug-in modules 260. In step 3195, output plug-in modules 260 display information based on time control and other input parameters.

Figure 32A:
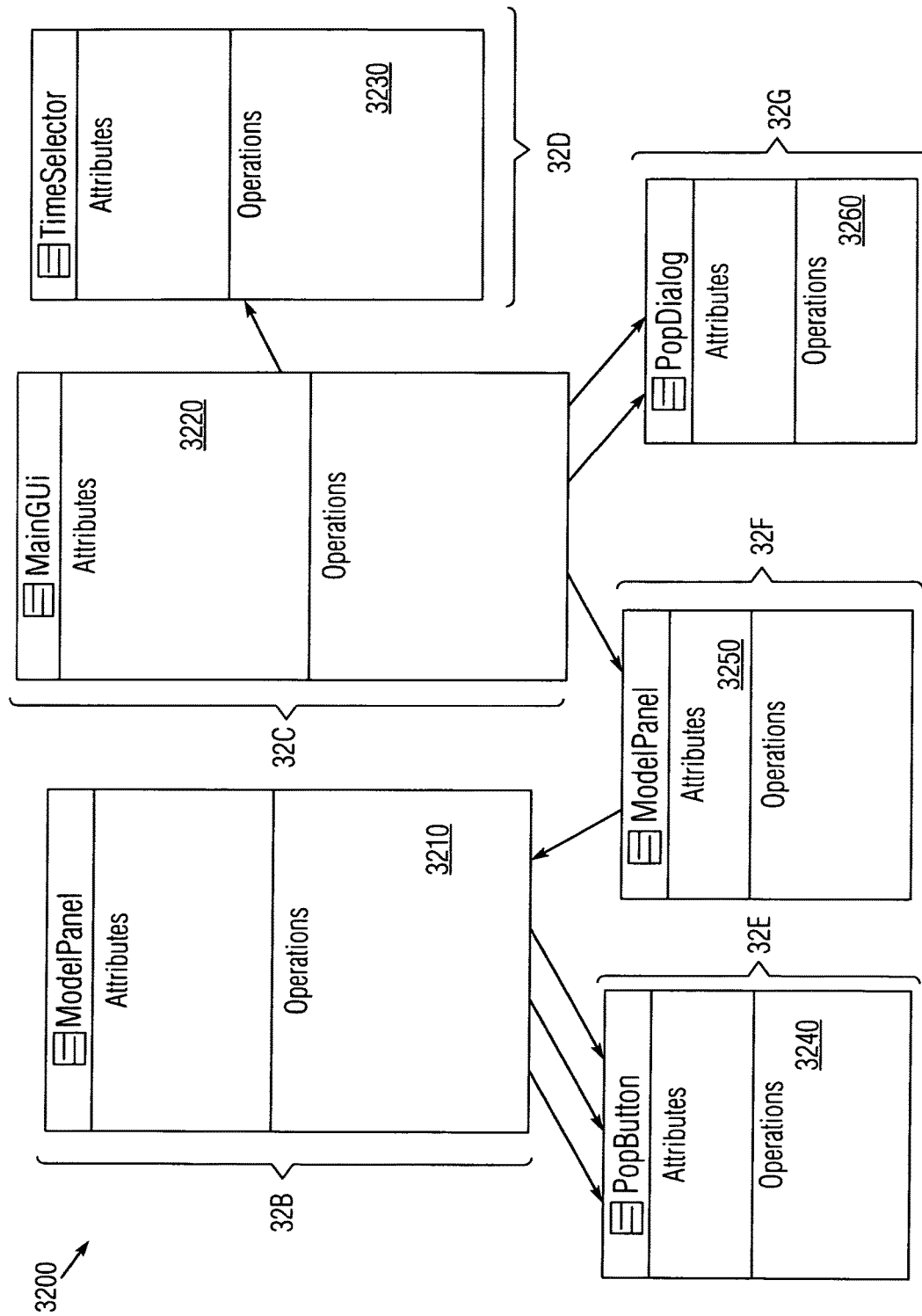

FIG. 32A shows an Osm executable file arrangement diagram 3200 with files that include attributes and operations. These files include ModelPanel 3210, MainGui 3220; TimeSelector 3230, PopButton 3240, ModelsPanel 3250 and PopDialog 3260. FIGS. 32B through 32G show these respective files in greater resolution. The ModelPanel 3210 provides addModel, deleteModel and editModel outputs to the PopButton 3240, and receives modelPanels input from the ModelsPanel 3250. The MainGui 3220 provides modelsPanel output to the ModelsPanel 3250, expFrame and output Frames outputs to the PopDialog 3260 and TimeSelector output to the TimeSelector 3230.

Figure 33A:
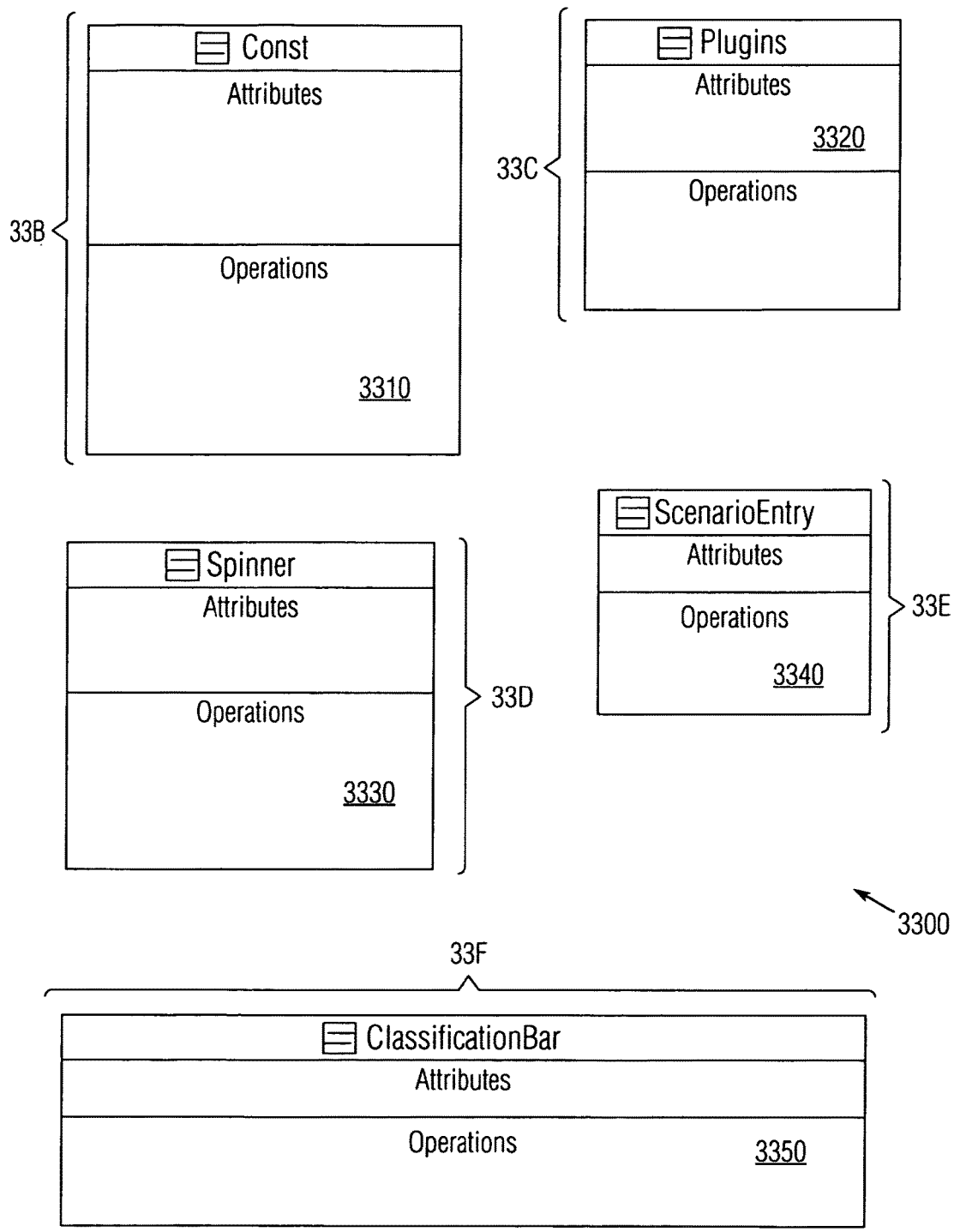
Figure 33E:
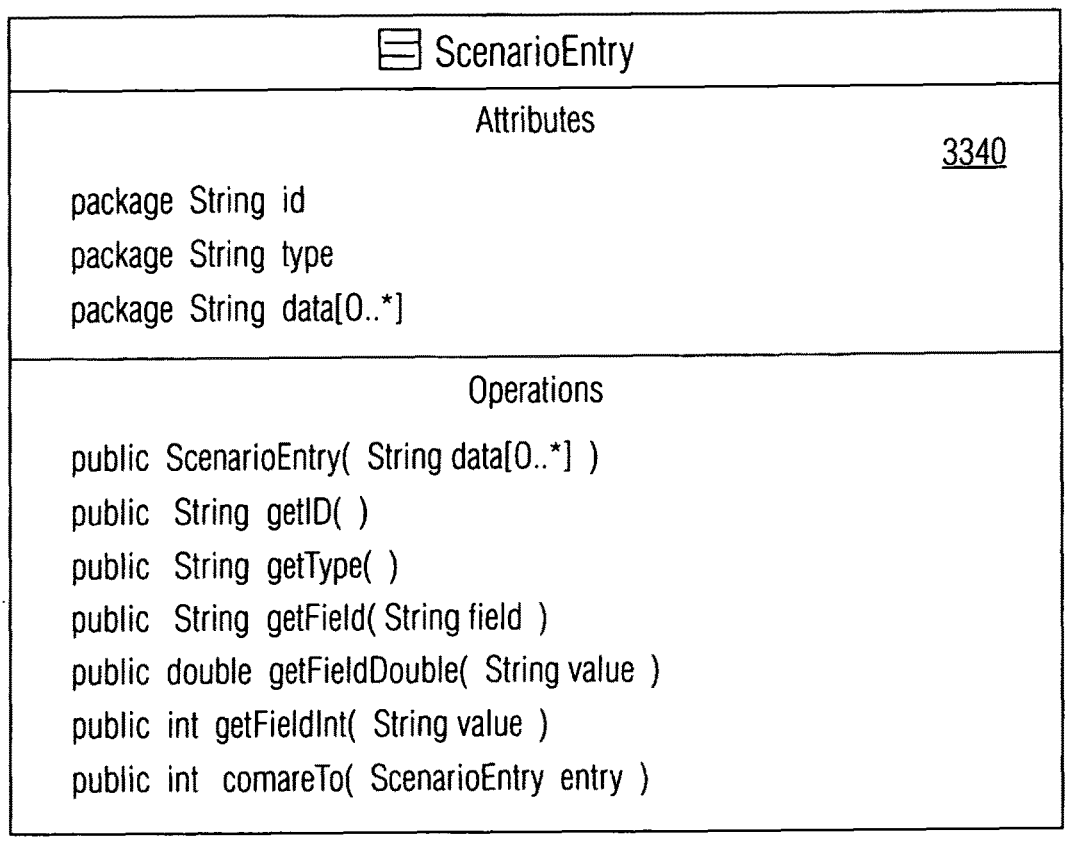

FIG. 33A shows a first Osm library file presentation diagram 3300 with files that include attributes and operations. These files include Const 3310, Plugins 3320, Spinner 3330, ScenarioEntry 3340 and ClassificationBar 3350. FIGS. 33B through 33F show these respective files in greater resolution.

Figure 34A:
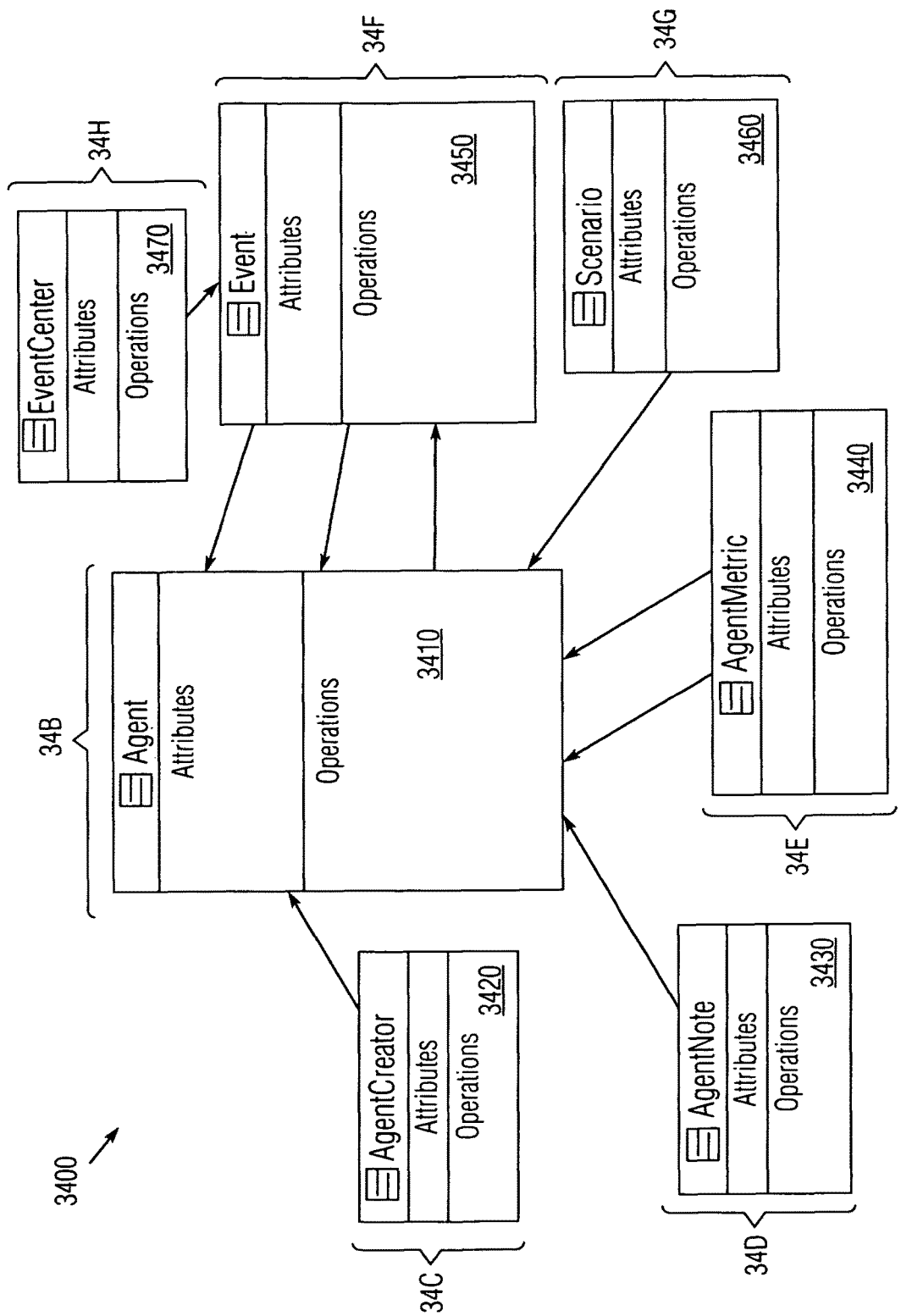

FIG. 34A shows a second Osm library file arrangement diagram 3400 with files that include attributes and operations. These files include Agent 3410, AgentCreator 3420, AgentNote 3430, AgentMetric 3440, Event 3450, Scenario 3460 and EventCenter 3470. FIGS. 34B through 34H show these respective files in greater resolution. The EventCenter 3470 provides events information to the Event 3450. The Agent 3410 receives input agent information from the AgentMetric 3440, Scenario 3460 Event 3450 (operational) and the AgentCreator 3420, as well as scheduler information from the Event 3450 (attributes). The Agent 3410 provides output information such as metrics to the AgentMetric 3440, notes to AgentNotes 3430 and events to Event 3450.

Figure 35A:
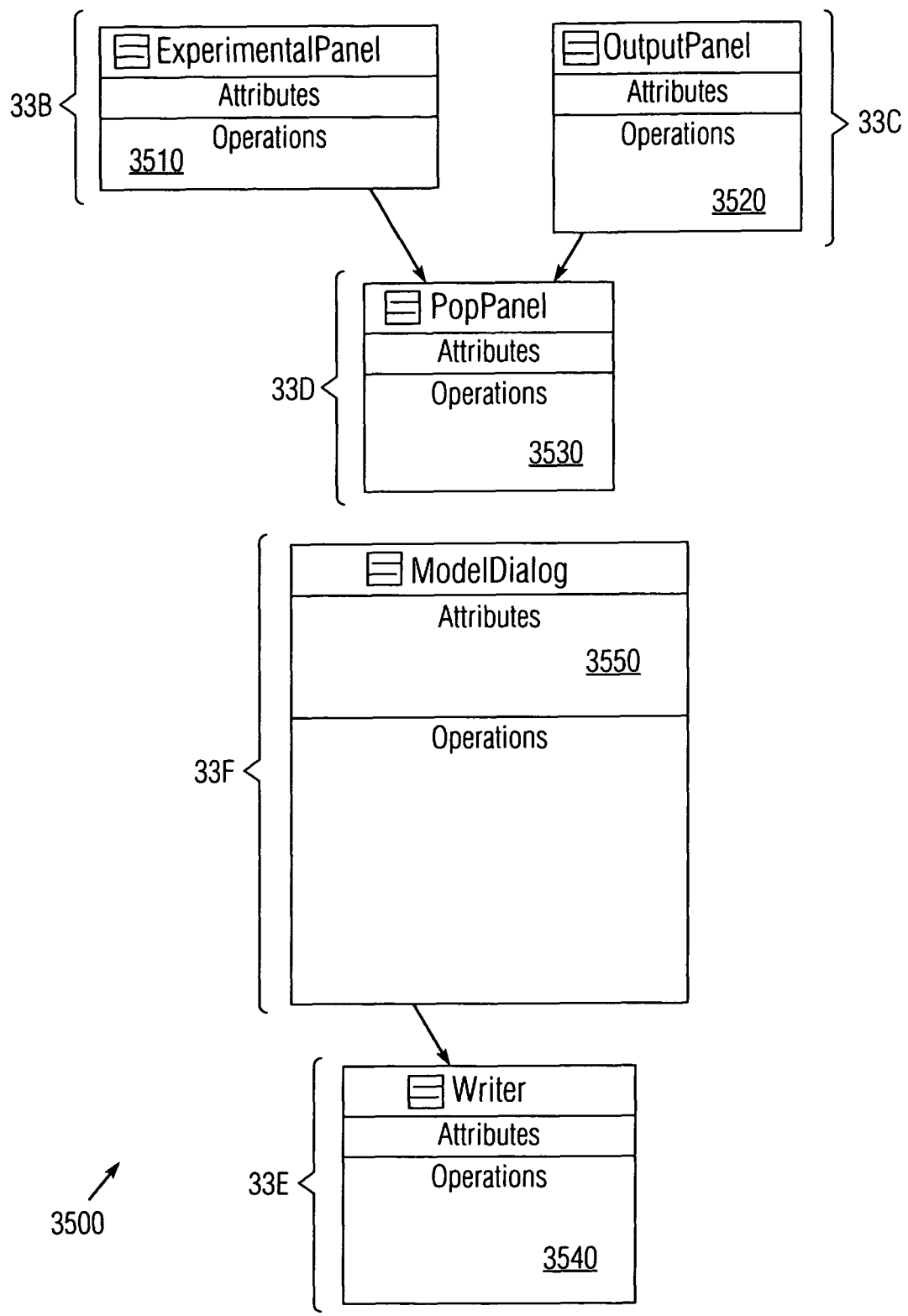

FIG. 35A shows a third Osm library file arrangement diagram 3500 with files that include attributes and operations. These files include ExperimentalPanel 3510, OutputPanel 3520, PopPanel 3530, Writer 3540 and ModelDialog 3550. FIGS. 35B through 35F show these respective files in greater resolution. The ExperimentalPanel 3510 and OutputPanel 3520 provide outputs to the PopPanel 3530. The ModelDialog 3550 provides writer output to the Writer 3540.

Quantitative advantages for the exemplary distributed modular architecture for simulation and modeling as compared to conventional integral techniques can be summarized by the following statistics for projects related to surface warfare (SUW) and missile defense agency (MDA). Lines of code for modules common to both projects are listed as follows:

| Module | Code Lines |
| --- | --- |
| OsmEXE | 2,242 |
| OsmLIB | 3,521 |
| basic experimental plug-in | 833 |
| events control plug-in | 399 |
| metrics output plug-in | 395 |
| DEVS simulator plug-in | 62 |
| libWorld | 5,134 |
| Total (common) | 13,610 |

Lines of code specific to these projects are listed as follows:

| Project | Lines specific | Lines combined |
| --- | --- | --- |
| SUW | 4,461 | 18,071 |
| MDA | 6,077 | 19,687 |

Thus, under conventional architecture without Osm, each project would constitute nearly twenty-thousand lines of code with everything interwoven. By contrast, the modular plug-in architecture enabled by Osm more than three quarters of the code to be common and thereby interchangeable and reusable.

Additionally, the modularity and ability to improve components would be maintained by only one group that has access to that portion of code. With Osm, anybody can produce a plug-in, and so anybody can contribute to such a project without necessity of understanding the entire code. If one had to produce SUW from scratch, that project would have required much longer time than the few months that completion was achieved. The realtime simulator plug-in module involved small amounts of code to implement, but completely changed the purpose of the tool. MDA routinely creates new assignments when only one component need be substituted in exemplary embodiments, such as the simulator frame.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

what is claimed is:

1. A computer-implemented modeling-and-simulation system for coordinating components by exchanging and sequencing instructions, said system comprising:
- a scenario file generator for creating a blank scenario file;
- a plug-in loader for loading an available plurality of plug-in modules;
- a module classifier for setting a classification to a highest rank plug-in module of said plurality of plug-in modules;
- an event detector for monitoring updating a plurality of events in time;
- a selection receiver for selecting experimental plug-in, simulator and model plug-in modules from said plurality of plug-in modules loading a scenario, and setting experimental parameters;
- a simulation processor for executing a simulation from said scenario and updating said time for triggering an event In said plurality of events;
- a model request processor for providing parameters from said experimental plug-in module to said model, plug-in module;
- an instance receiver for receiving model instances from said model plug-in module;
- an instruction processor for instructing said simulator plug-in module to execute instructions until satisfaction of terminal conditions and in response to initiation by said experimental plug-in module; and
- an output provider for disseminating display information based on said updating events, wherein said model, simulator, experimental and output plug-in modules, and said scenario are independent.

2. The system according to claim 1, wherein said simulator plug-in module executes said model plug-in module.

3. The system according to claim 1, wherein said model plug-in module creates an agent.

4. The system according to claim 3, wherein said agent instructs said event detector to add a new event and remove a prior event, and said agent responds to said upcoming event.

5. The system according to claim 4, wherein said agent instructs said event detector to add a new event and remove a prior event, and said agent responds to said upcoming event.

6. The system according to claim 4, wherein said agent includes instances for response characterization.

7. The system according to claim 4, wherein said output plug-in module includes a display format selected from at least one of numerical parameters display and a geographical map.

8. The system according to claim 4, further comprising a library for storing said instances from said plurality of plug-in modules.

9. The system according to claim 1, wherein
- said model plug-in module is swappable with another model plug-in module,
- said simulation plug-in module is swappable with another simulation plug-in module,
- said experimental plug-in module is swappable with another experimental plug-in module, and
- said output plug-in module is swappable with another output plug-in module.

10. A non-transitory computer-readable modeling-and-simulation medium for coordinating components by exchanging and sequencing instructions, said medium including components for execution on a processor, comprising:
- a master executable program for providing time control;
- a master library including class definitions and an event scheduler;
- a model frame including a scenario and a model plug-in module; wherein said executable program loads and saves said scenario, and said model plug-in module creates an agent responsive to an event of a plurality of events provided by said event scheduler;
- a simulator frame including a simulator plug-in, said simulator frame updating time for triggering said event in response to said time control;
- an experimental frame for executing a scenario simulation from said simulator plug-in module to produce an agent response; and
- an output plug-in module for displaying said agent response in response to said time control, wherein said model, simulator, experimental and output plug-in modules, and said scenario are independent.

11. The medium according to claim 10, wherein said agent adds a new event and removes a prior event In said plurality of events for said event scheduler.

12. The medium according to claim 10, wherein executable program loads and saves a scenario definition for said model frame.

13. The medium according to claim 10, wherein
- said model plug-in module is swappable with another model plug-in module,
- said simulation plug-in module is swappable with another simulation plug-in module,
- said experimental plug-in module is swappable with another experimental plug-in module, and
- said output plug-in module is swappable with another output plug-in module.

* * * * *